(12) United States Patent
Hosogane et al.

(10) Patent No.: US 6,621,740 B2
(45) Date of Patent: Sep. 16, 2003

(54) NON-VOLATILE SEMICONDUCTOR MEMORY DEVICE

(75) Inventors: Akira Hosogane, Hyogo (JP); Yoshitsugu Dohi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/977,296

(22) Filed: Oct. 16, 2001

(65) Prior Publication Data

US 2002/0101763 A1 Aug. 1, 2002

(30) Foreign Application Priority Data

Feb. 1, 2001 (JP) .......................................... 2001-025241

(51) Int. Cl.[7] .............................. G11C 16/06; G11C 7/00
(52) U.S. Cl. ................................. 365/185.22; 365/189.01
(58) Field of Search ........................ 365/185.04, 185.05, 365/185.22, 185.24, 185.29, 185.33, 189.01

(56) References Cited

U.S. PATENT DOCUMENTS

| 5,740,109 A | * | 4/1998 | Morton et al. ......... 365/185.18 |
| 5,862,074 A | * | 1/1999 | Park ...................... 365/185.03 |
| 5,978,264 A | * | 11/1999 | Onakado et al. ....... 365/185.11 |
| 5,999,450 A | * | 12/1999 | Dallabora et al. ..... 365/185.08 |
| 6,154,391 A | * | 11/2000 | Takeuchi et al. ....... 365/185.24 |

* cited by examiner

Primary Examiner—Thong Le
(74) Attorney, Agent, or Firm—McDermott, Will & Emery

(57) ABSTRACT

A specific row of memory cells in a flash memory is set to be in a lock mode state, which affects reading of data in other rows of memory cells in a common memory array. Thus, a flash memory having a data concealing function is achieved.

13 Claims, 19 Drawing Sheets

NON-VOLATILE SEMICONDUCTOR MEMORY DEVICE

BACKGROUND OF THE INVENTION

1. Field of the Invention

The present invention relates to a non-volatile semiconductor device, and more particularly, to a configuration for ensuring security to maintain the confidentiality of stored information.

2. Description of the Background Art

Non-volatile semiconductor memory devices such as a flash EEPROM (Electrically Erasable/Programmable Read Only Memory; hereinafter referred to as "flash memory") have advantageous characteristics that data can be stored in a non-volatile manner and can be held without any power supply.

FIG. 18 schematically shows the entire configuration of a conventional flash memory. In FIG. 18, a flash memory 900 includes: a memory array 901 having a plurality of non-volatile memory cells arranged in a matrix of rows and columns; an X-decoder 902 for selecting a row of memory cells in memory array 901 in accordance with a received X-address; a Y-decoder 903 for generating a column selecting signal for selecting a column of memory cells in memory array 901; a Y-gate 904 for connecting a selected column of memory array 901 to an internal data line in accordance with the column selecting signal received from Y-decoder 903; and a data register 905 for temporarily storing write data in data writing. Data register 905 includes a register circuit provided corresponding to each of the columns of memory cells in memory array 901, and stores write data applied via Y-gate 904. Writing and write verification of data are carried out in accordance with the data stored in data register 905.

Flash memory 900 further includes: a data input/output buffer 907 for externally inputting/outputting data via a data/address terminal group 906; an address input buffer 908 for receiving an address signal applied via address/data terminal group 906 to generate internal address signals (X- and Y-address signals); and a control signal input buffer circuit 910 receiving control signals applied via a control terminal group 909 to generate internal control signals.

The control signals applied to control terminal group 909 include an output enable signal OE instructing reading of data, a chip enable signal CE instructing that flash memory 900 is selected, and a write enable signal WE designating data writing or the timing of command taking.

Control signal input buffer circuit 910 includes an OE buffer 910a receiving output enable signal OE, a CE buffer 910b receiving chip enable signal CE, a WE buffer 910c receiving write enable signal WE, and a buffer 910d receiving the other control signals. When chip enable signal CE is activated, flash memory 900 determines that the externally-applied control signals are valid and takes in currently applied data/address signal. An internal output enable signal from OE buffer 910a is applied to data input/output buffer 907 and to address input buffer 908, and an internal chip enable signal from CE buffer 910b is also applied to data input/output buffer 907 and address input buffer 908. When both output enable signal OE and chip enable signal CE are activated, data reading is carried out.

Flash memory 900 further includes: an X-address buffer 911 for buffering the internal address signal received from address input buffer 908 to generate an internal X-address signal to be supplied to X-decoder 902; a write data input driver 912 buffering the write data received from data input/output buffer 907 and writing the data into data register 905 via Y-gate 904 in data writing; a read data output amplifier 913 for amplifying internal read data read out via Y-gate 904 and applying the amplified data to data input/output buffer 907 in data reading; a command control circuit 914 receiving the internal control signals from control signal input circuit 910 and the command from address input buffer 908 and determining a designated operation mode; a read/write/erasure control circuit 915 generating control signals required for the designated operation mode according to the operation mode instruction from command control circuit 914; and a high voltage generating circuit 916 for generating a high voltage required for the write/erasure, under the control of read/write/erasure control circuit 915.

For example, when the internal chip enable signal from CE buffer 910b is being activated, command control circuit 914 takes in a command from address input buffer 908 in response to the rise of the internal write enable signal from WE buffer 910c and decodes the command that is taken in. Read/write/erasure control circuit 915 is constituted by a processor such as a sequence controller, and generates control signals required for the operation designated by command control circuit 914 to control the operation of each circuit.

High voltage generating circuit 916 generates a high voltage to be required for write/erasure. The high voltage generated by high voltage generating circuit 916 is different depending on a configuration of the memory array, and portions that require such a voltage are supplied with the generated high voltage. To the memory cells and the substrate region, a high voltage is actually applied via X-decoder 902, Y-decoder 904 and a source line decoder (not shown). Though FIG. 18 shows that the high voltage from high voltage generating circuit 916 is applied to X-decoder 902, the high voltage generated by high voltage generating circuit 916 may also be applied to the substrate region of memory array 901 (on a sector basis) or to a source line.

Read/write/erasure control circuit 915 further controls command control circuit 914 for the acceptance of a command in writing/erasing. Read/write/erasure control circuit 915 controls the operation of X-address buffer 911 to sequentially change an X-address in erasure verification mode and to select memory cells when a flash (collective) erasure is performed at the erasing operation, for example.

In memory array 901, each of the non-volatile memory cells arranged in a matrix of rows and columns is generally constituted by a floating gate type transistor, and stores information depending on a threshold voltage of the floating gate type transistor.

FIG. 19 shows an example of a configuration of memory array 901 shown in FIG. 18. FIG. 19 exemplifies a configuration of an array portion of an AND-type flash memory.

In FIG. 19, memory cells MC are arranged in rows and columns, and an arrangement example is shown in FIG. 19, in which memory cells are arranged in 10 rows and 5 columns. A memory cell MC is constituted by one floating gate type field effect transistor MT. A bit line BL (BL1–BL5) is arranged corresponding to each column of memory cells MC, and a word line WL (WL1–WL10) is arranged corresponding to each row of memory cells MC. These memory cells MC are divided into a plurality of sectors in the column direction. One sector is constituted by memory units MU each including a predetermined number (five in FIG. 19) of memory cells MC in each column. The memory cells MC included in the same memory unit MU are connected in parallel between a sub bit line SBL and a sub source line SSL. Sub bit line SBL is connected to a corresponding bit line BL (BL1–BL5) via a drain-side sector selecting transistor SWD, whereas sub source line SSL is connected to a main source line MSL via a source-side sector selecting transistor SWS. Drain-side sector selecting transistor SWD is selectively rendered conductive in response to a sector selecting signal VD (VD1, VD2), whereas source-side sector selecting transistor SWS is selectively rendered conductive in response to a sector selecting signal VS (VS1, VS2). In the AND-type flash memory, data can be erased sector by sector, and hence fast re-writing of data can be realized.

A memory cell MC stores information depending on the threshold voltage of memory transistor MT.

FIG. 20 shows an example of the distribution of the threshold voltages of memory cells MC. In FIG. 20, the vertical axis indicates the voltage and the horizontal axis indicates the distribution (the relative number of memory cells). In FIG. 20, when a memory cell has a threshold voltage included in a region of "1," the memory cell is in an erased state, whereas when a memory cell has a threshold voltage included in a region of "0," the memory cell is in a written state (programmed state). This means that the memory cell in the erased state stores data "1," and the memory cell in the written or programmed state stores data "0."

Application of a voltage VWL1 between the threshold voltage in the written state and that in the erased state to the control gates of memory transistors MT (to a word line) renders memory cells MC conductive or non-conductive in accordance with the stored information therein. This is detected by read data output amplifier 913 shown in FIG. 18, and thus data reading is performed.

Specifically, for example, when data stored in a memory cell connected to a word line WL3 is read out, a source voltage VL1 on main source line MSL provided corresponding to a sector including word line WL3 is set to a ground voltage (0V), and sector selecting signals VD1 and VS1 are set to the voltage level of e.g. 7V. Sector selecting signals VD2 and VS2 are at the level of the ground voltage. The high voltage of e.g. 7V is applied to sector selecting signals VD1 and VS1 so that sector selecting transistors SWD and SWS attain a deep ON state and that data in the memory cells can rapidly and reliably be read out. A read voltage VWL1 is applied to word line WL3, and a non-selecting voltage VWL4 is applied to the remaining word lines WL1, WL2, WL4 and WL5. Read voltage VWL1 is at an intermediate voltage level that lies between the upper limit of the threshold voltage in the erased state and the lower limit of the threshold voltage in the written state. When the threshold voltages of memory cell MC connected to word line WL 3 is in the region of "1," memory transistor MT is rendered conductive, and a corresponding bit line BL (any one of BL1 to BL5) will be electrically connected to main source line MSL by sector selecting transistors SWD and SWS and the selected memory transistor MT, or the corresponding bit line BL is short-circuited to the ground voltage.

Whereas, when the threshold voltage of memory transistor MT is in the region of "0" in FIG. 20, the corresponding memory transistor MT is non-conductive, and a corresponding bit line BL is isolated from source lines SSL and MSL.

In memory cell MC supplied with non-selecting voltage VWL4 at control gates thereof, the threshold voltage is higher than non-selecting voltage VWL4, irrespective of the region where the threshold voltages lies, i.e. irrespective of whether the memory cell is in the region "1" or in the region "0," and the memory cell MC is maintained non-conductive. Therefore, the memory cells connected to these non-selected word lines have no effects on reading of the data in memory cells MC connected to selecting word line WL3.

In such a state, whether or not current flows in a corresponding bit line BL, or whether or not bit line BL is maintained in a pre-charged state is detected by read data output amplifier 913, and data reading is performed in accordance with the result of the detection.

The threshold voltage is set in accordance with stored information by injecting/extracting electrons into/from the floating gate.

FIG. 21 schematically shows a configuration of a memory transistor MT constituting a memory cell MC. In FIG. 21, memory transistor MT includes: impurity regions 921 and 922 formed spaced from each other on the surface of a substrate region 920; a floating gate 923 formed on a channel region between impurity regions 921 and 922 with a gate insulating film (not shown) interposed; and a control gate 924 formed on floating gate 923 with an interlayer insulating film (not shown) interposed. Floating gate 923 is enclosed by the insulating film to be electrically insulated, so that the state of storing electrons in floating gate 923 does not change even at the power-off, allowing non-volatile storage of information.

Injection/extraction of electrons into/from floating gate 923 is carried out by utilizing channel hot electrons or by utilizing Fowler-Nordheim (FN) tunneling current. FIG. 21 shows an applied voltage when electrons e are injected into floating gate 923 using the FN tunneling current. In the injection of electrons, a positive high voltage of e.g. 15V is applied to control gate 924, and substrate region 920 and impurity regions 921 and 922 are set to the ground voltage (0V). This allows the FN tunneling current to flow between floating gate 923 and substrate region 920 or impurity regions 921 and 922, and thus electrons are injected into floating gate 923. In a state where electrons are injected into floating gate 923, memory transistor MT has a high threshold voltage, and thus the memory cell is in a written state where data "0" is stored therein.

FIG. 22 shows an applied voltage to the memory transistor when electrons are extracted from the floating gate. When the electrons e are extracted from the floating gate, a negative high voltage of e.g. −16V is applied to the control gate, and a positive voltage of e.g. 2V is applied to impurity regions 921 and 922 and substrate region 920. In this state, the FN tunneling current flow is caused to allow the electrons to flow from floating gate 923 to substrate region 920 or to impurity regions 921 and 922, and thus the electrons are extracted from floating gate 923. In such a state where the electrons are extracted, memory transistor MT has a reduced threshold voltage.

Which of the written state (programmed state) and the erased state of a memory cell corresponds to which of the state with a high threshold voltage (hereinafter referred to as "high-threshold state") and a state with a low threshold voltage hereinafter referred to as "low-threshold state") is determined depending on an array configuration and a control method. That is, in one flash memory, the high-threshold state is associated with the erased state whereas the low-threshold state is associated with the written state. However, in either case, a complicated procedure is required for the two states of the memory cell to fall within the threshold-voltage distribution regions specific to the respective states. A procedure of the erasing operation used where the low-threshold state is correlated with the erased state, as shown in FIG. 20, will be described below.

FIG. 23 is a flow chart representing the procedure of the erasing operation. First, an erasure address specifying an erasure region and an erasure command are supplied (step S1). When the erasure is performed sector by sector, a sector address is applied specifying a sector for which the erasure is to be performed. When the erasure command is applied, read/write/erasure control circuit 915 shown in FIG. 18 generates a voltage required for the erasing operation, i.e. a negative high voltage (−16V) and a positive voltage (2V) (step 2). The negative high voltage is generated by a high voltage generating circuit 916 shown in FIG. 18. Subsequently, an erasing bias is applied to the target memory cells for erasure, under the control of read/write/ erasure control circuit 916 (step S3). In application of the erasing bias, in the array configuration shown in FIG. 18, sector selecting signals VD and VS are driven to be in a selected state in accordance with an address signal, and a negative high voltage is applied to a word line WL via the X-decoder. Source voltage VS on main source line MSL is set to be at 2V, and a voltage of 2V is transmitted to a bit line BL. The application of the erasing bias to the memory cells is performed in a pulse-like manner, and is stopped after a predetermined time period.

Subsequently, an erasure verification voltage VWL2 to be transmitted onto word line WL is generated in order to determine whether or not the memory cells are in the erased state (step S4). Thereafter, a row and a column are selected, and the erasure verification voltage VWL2 is transmitted onto a selected word line (step S5).

Erasure verification voltage VWL2 corresponds to the upper limit of the threshold voltage in the erasure state, as shown in FIG. 24. In this state, it is determined whether or not the memory cells are conductive and the threshold voltages thereof are distributed within the region of "1" shown in FIG. 24 (step S6). If a memory cell is non-conductive in the determining operation, meaning that the memory cell is not yet in the erasure state, the number of applications of the erasing bias is increased by one, and the erasing bias is re-applied (step S7). Subsequently, it is determined whether or not the number of times of application of the erasing bias exceeds a predetermined limit number of times (step S8). If it exceeds the limit number, it is considered as occurrence of an erasure failure, and a necessary error process is carried out (step S9).

If the number of times of application of the erasing bias is no more than the limit number, the procedure from step S3 et seq. is executed again.

Erasure verification is carried out in step S6, and if the threshold voltages are distributed within the region "1" and if it is determined that all the target memory cells for erasing are in the erasure state, then the voltage transmitted to the word line is set to be at an over-erasure verification voltage VWL3 in order to determine whether or not these memory cells are in an excessively erased state (over-erasure state) (step S10). The over-erasure verification voltage VWL3 corresponds to a voltage of the lower limit in the distribution of the threshold voltages within the region of "1" The erasure verifying operation is again carried out by transmitting over-erasure verification voltage VWL3 onto a word line of a erasure target via the X-decoder (step 11). Subsequently, it is determined whether or not current flows in bit line, as in the case of the erasure verification. All the memory cells of a erasure target are checked for over-erasure. If all the target memory cells are maintained non-conductive at the application of over-erasure verification voltage VWL3, it is determined that the erasing is normally performed (step S12). If the result of the check for the over-erasing indicates successful, a process required for terminating the erasing operation is executed (step S13). The terminating process in the step S13 includes, for example, a process of resetting the erasure voltage in step S12.

If current flows in the bit line in step S12, it indicates that an over-erased memory cell is present, and the threshold voltage of the memory cell in the over-erasure state must be increased back to be within the region of "1", and hence a write-back procedure is executed as described below.

FIG. 25 is a flow chart showing the write-back procedure. The write-back procedure shown in FIG. 25 is also executed under the control of read/write/erasure control circuit 915 shown in FIG. 18. First, in order to apply a voltage required for the write-back, a required high voltage is generated by high voltage generating circuit 916 under the control of read/write/erasure control circuit 915 (step S20). At the write-back, a positive high voltage (15V) is applied to the control gate of a target memory cell for write-back, and the ground voltage (0V) is applied to the source (source line) and the drain (bit line). The write-back process is executed for the memory cell in the over-erasure state.

Subsequent to the step S20 of setting up the power-supply, a row and a column are selected, and a write-back bias is applied to the memory cell in the over-erasure state (step S21). The write-back bias is also applied in the pulse-like manner and is applied only for a predetermined time period. Subsequently, in order to verify whether or not the write-back is normally executed, the potential of the word line to which the target memory cell for the write-back is connected is set to the voltage level of over-erasure verification voltage VWL3 (step S22). In this state, whether or not current flows in the bit line is detected (step S23).

Subsequently, in step S24, it is determined whether or not current flows in the bit line. If the current flows in the bit line, the memory cell is still in the over-erasure state, so that the number of times of application of the write-back bias is incremented by one (step S25). Then, it is determined whether or not the number of times of application of the write-back bias exceeds the limit number of times (step S26), and if it does not exceed the limit number, the processes from step S20 et seq. is executed again. On the other hand, if the number of times of application of the write-back bias exceeds the limit, it means that the memory cell is in the over-erasure state, and the memory cell is determined as a failure and a necessary error process is executed (step S27).

On the other hand, if it is determined, in step in S24, that no current flows in the bit line and the write-back is normally performed, the voltage of the word line of the target memory cell for the write-back is set to an over-write (over-programming) verification voltage VWL2 in order to determine whether or not the threshold voltage of the memory cell is beyond the distribution region of the threshold voltages in the erasure state due to this write-back (step S28). The over-write verification voltage VWL2 is at a voltage level corresponding to the threshold voltage of the upper limit in the distribution of the threshold voltages in the region of "1" in FIG. 24. Subsequently, a column is selected, and data in an internal memory cell is read out to detect whether or not current flows in the bit line (step S29). In step S29, if all the target memory cells for the write-back are conductive, meaning that the write-back is normally performed, then a necessary process for termination of the write-back is executed (step S31). By step S31, one erasing operation is completed. In step S30, if an over-written memory cell is present in the target memory cells for the write-back, it is determined that the normal erasing could not be carried out, and the error process in step S27 is executed.

A series of such process procedures allows the distribution of threshold voltages of the memory cells in the erasure state to fall within the region of "1."

It is noted that, in a flash memory in which the high-threshold state is defined as the erasure state, erasing is carried out by the procedure of increasing the threshold voltage whereas writing or programming is carried out by the procedure of reducing the threshold voltage in the above-described process procedures shown in FIGS. 23 and 25. The process procedures shown in FIGS. 23 and 25 can be used only by replacing the terms "erasure/write" with each other. Therefore, in such a flash memory, a process similar to the process procedure shown in FIGS. 23 and 25 can be executed in programming.

A flash memory requires no power-supply for holding of data, so that it is suitable for the purpose of data storage in portable equipment and so forth. However, when personal information or the like is stored, which requires confidentiality, a mechanism for protecting (concealing) such data in some form is necessary to prevent the storage information from leaking to an outside. Though the flash memory generally contains a configuration utilizing a lock bit for inhibiting rewriting of information or a configuration utilizing a write protect program, such a configuration only inhibits rewriting of data, and reading out of information is not inhibited.

When a circuit-wise solution is provided within a memory as a mechanism for securing such confidentiality, the chip area is increased, leading to an increased cost. Moreover, when a protection circuit for securing the confidentiality is provided external to the flash memory, the circuit scale of the entire system is increased, also leading to the increased cost. Furthermore, an external circuit may possibly be disassembled, causing a problem in that the protection mechanism is decoded and no longer functions as the mechanism for maintaining confidentiality.

SUMMARY OF THE INVENTION

An object of the present invention is to provide a flash memory that can easily maintain the confidentiality of stored data without increase of a circuit scale.

Another object of the present invention is to provide a flash memory including a lock mechanism for maintaining the confidentiality of stored data, and an unlock function of reconstructing the stored data concealed by the lock mechanism data, with only a minimum necessary addition/change in a part of a control sequence.

A non-volatile semiconductor memory device according to the present invention includes a memory array having a plurality of non-volatile memory cells arranged in a plurality of rows and a plurality of columns; a plurality of bit lines, each of which is arranged corresponding to each of the columns; and a plurality of word lines, each of which is arranged corresponding to each of the rows. The non-volatile memory cell is constituted by a memory transistor having different threshold voltages in accordance with stored information.

The non-volatile semiconductor memory device according to the present invention further includes a circuit for reading data in accordance with whether or not a selected bit line is connected to a predetermined voltage source via corresponding memory cell in data reading; and a control circuit for setting a state of at least one row of memory cells to a first state affecting data reading of the other rows of memory cells in accordance with a first operation mode instruction.

In the first operation mode, the state of at least one row of memory cells is set to be in the first state affecting the data reading of the other rows of memory cells, so that data in the other rows of memory cells cannot be normally read in the first operation mode, and hence the other rows of memory cells can be concealed from the outside.

The state of the memory cells can be set simply by changing the level of erasure/write verification voltage. Therefore, there is no need to add a dedicated circuit and an existing write/erasure control sequence can be utilized, resulting in minimum necessary increase of the control sequence.

Furthermore, by allowing a second state, the memory cells set at the first state can be set in a state not affecting data reading of the other rows of memory cells, so that data stored in the other rows of memory cells can be read out, and thus an unlock mechanism can similarly be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
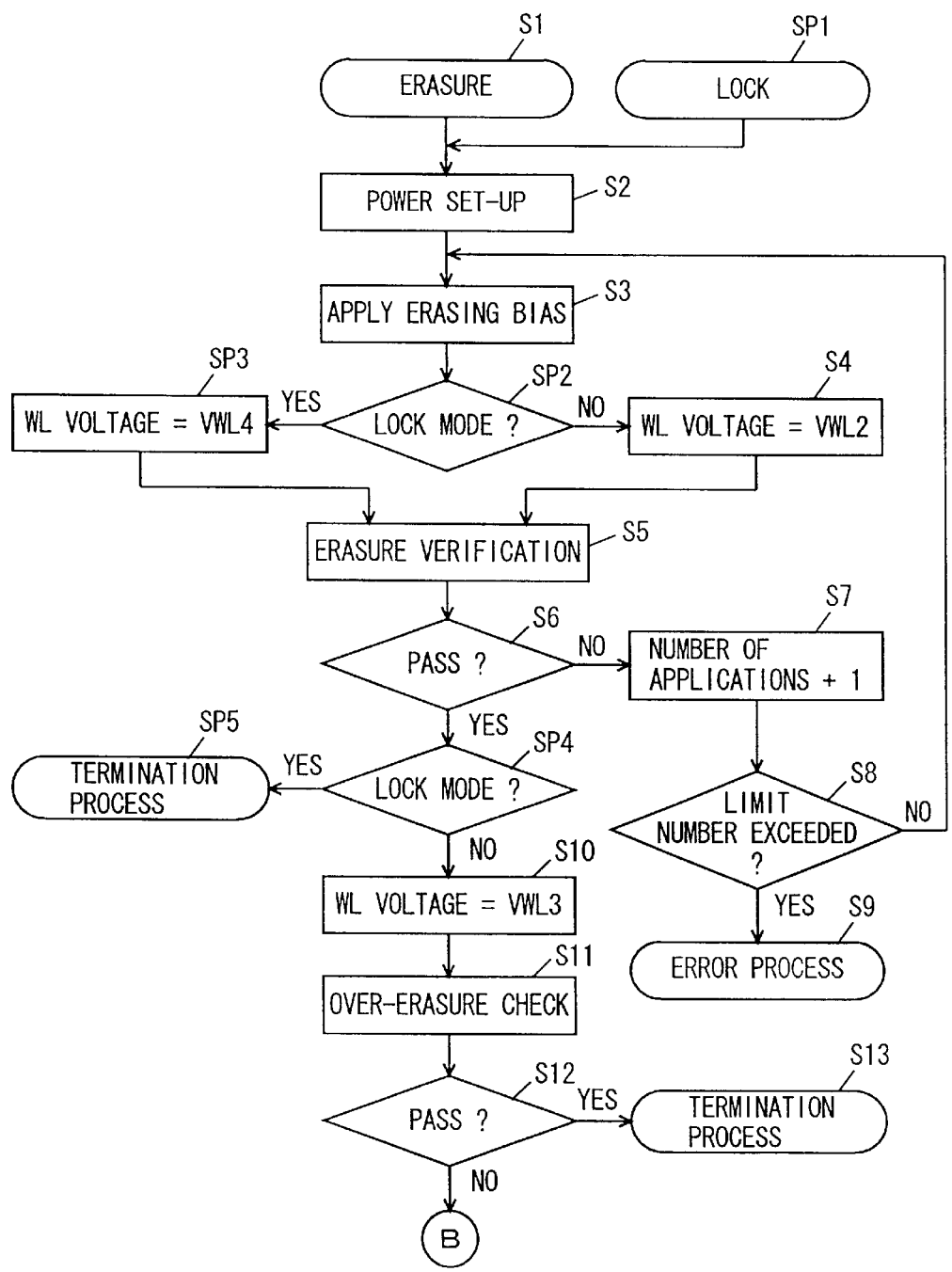
FIG. 1 is a flow chart representing a process procedure in a lock mode according to the first embodiment of the present invention.
Figure 18:
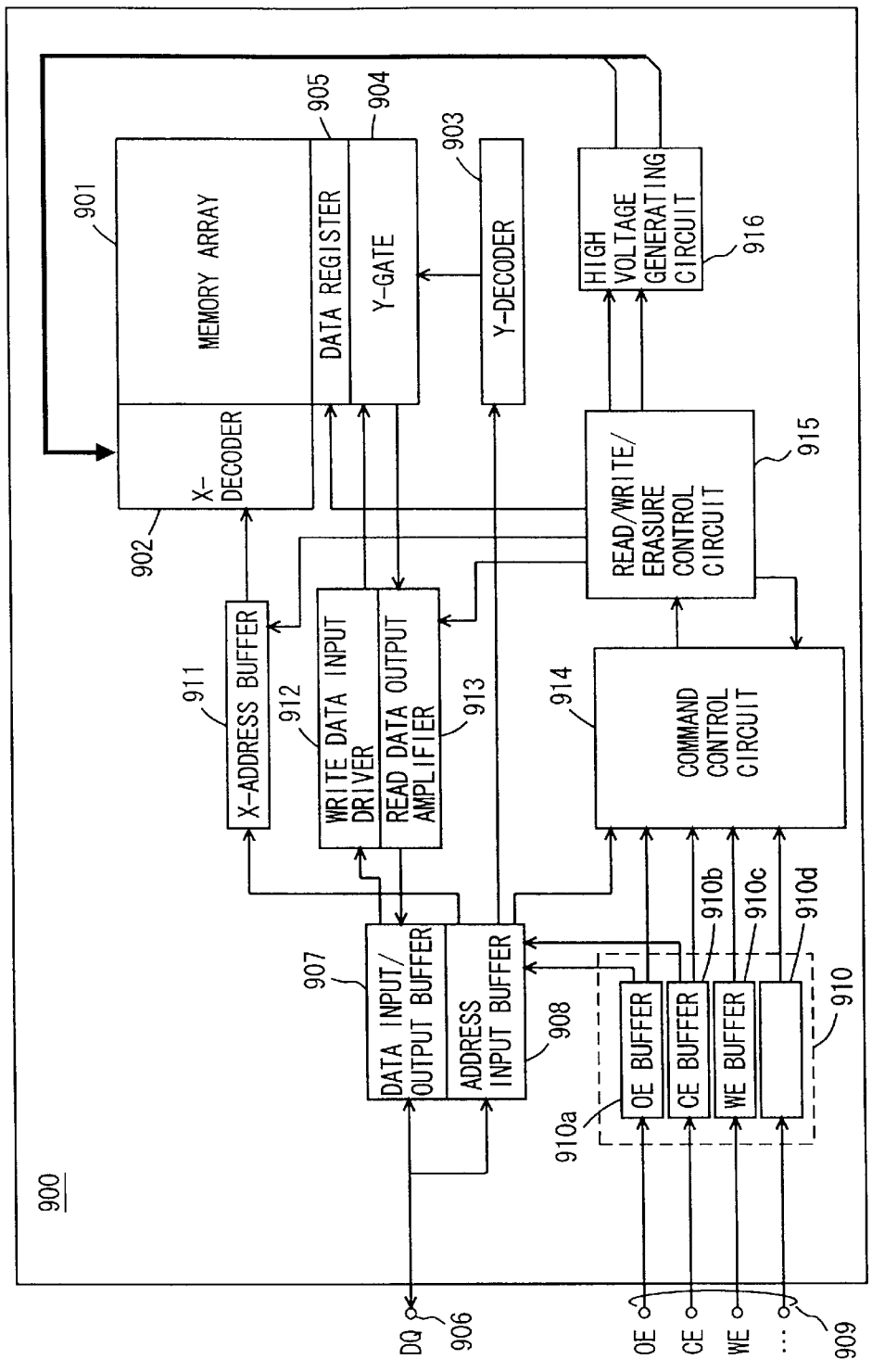
FIG. 18 schematically shows the entire configuration of a conventional flash memory.
Figure 19:
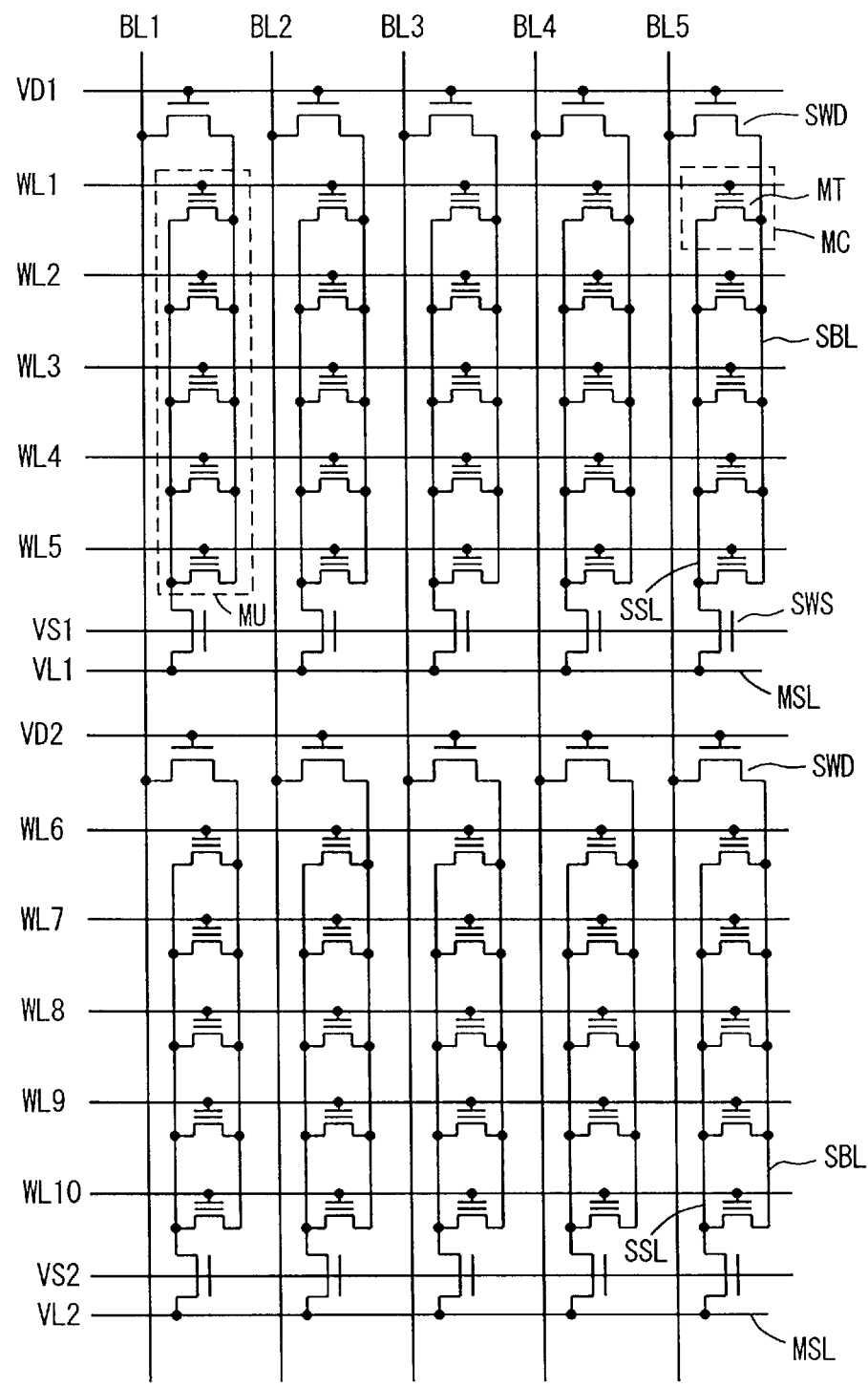
FIG. 19 shows a configuration of an array portion of the conventional flash memory.
Figure 20:
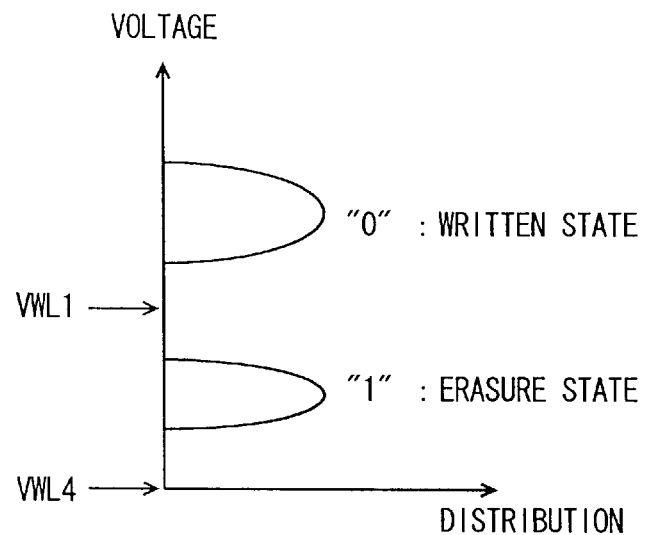
FIG. 20 shows the distribution of threshold voltages of memory cells in the flash memory.

FIG. 1 is a flow chart representing an operation of a flash memory when a lock function is set, according to the first embodiment of the present invention. The flow chart shown in FIG. 1 illustrates a process procedure when the lock function is provided for an AND-type flash memory in which a low-threshold state of a memory cell is associated with an erasure state whereas a high-threshold state is associated with a write state. The configuration of an array portion of the AND-type flash memory is similar to that shown in FIG. 19. Further, the process procedure shown in FIG. 1 is executed under the control of read/write/erasure control circuit 915 shown in FIG. 18. Read/write/erasure control circuit 915 is constituted by e.g. a sequence controller, and is subject to change in a part of a program in which the process procedure is described.

In the present invention, a lock command for realizing the lock function is provided, in addition to an erasure command instructing erasing of data. The lock command is applied together with e.g. a specified address. Memory cells in a specified row designated by the address signal is set to be in the lock mode state, realizing the function of locking the data reading of the other memory cells.

Figure 23:
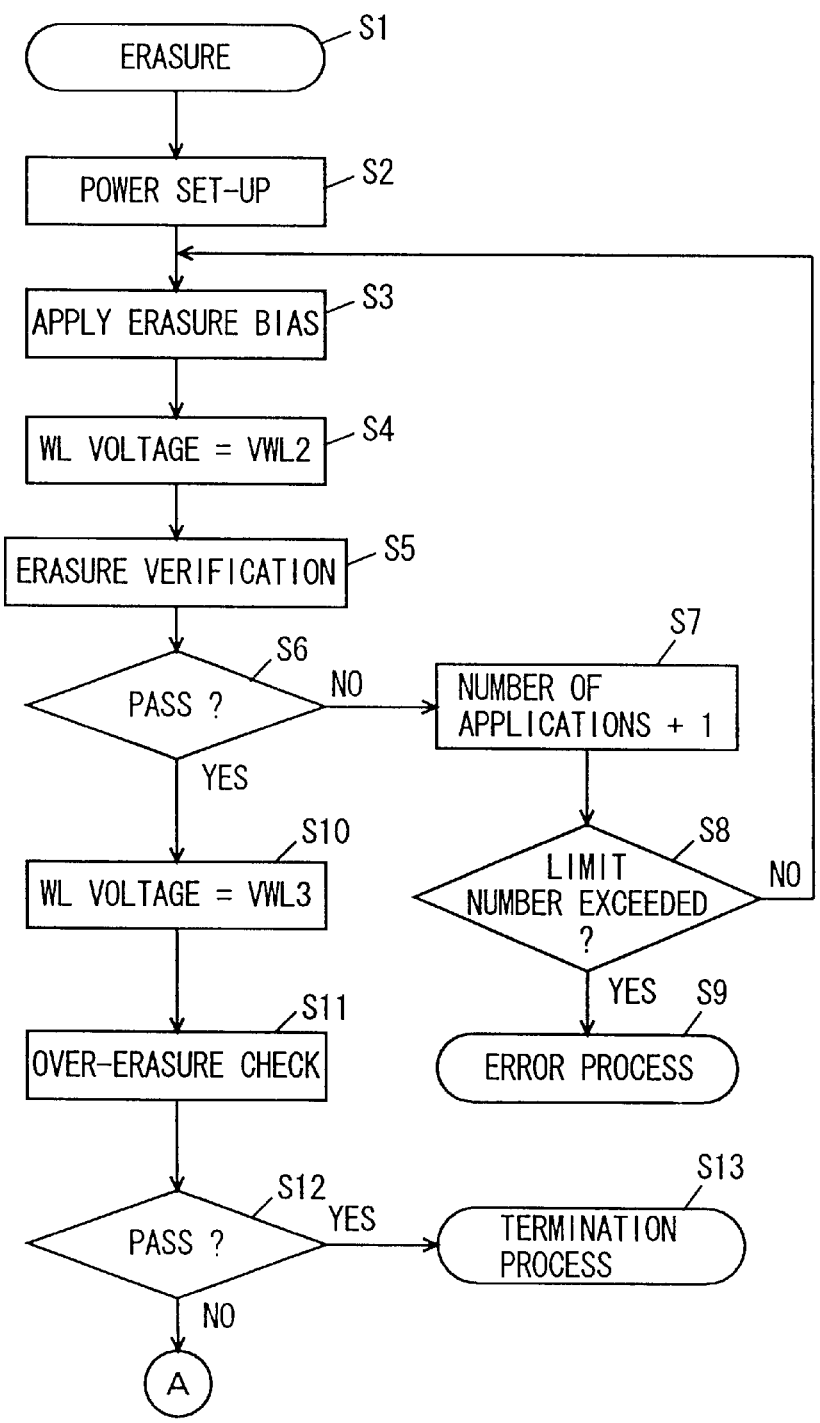
FIG. 23 is a flow chart representing a procedure of an erasure process for the conventional flash memory.

The process flow realizing such a lock function shares a process procedure with the flow in the erasing operation, so that the steps corresponding to the steps in the conventional erasing process procedure shown in FIG. 23 are denoted by the same reference numerals.

Figure 22:
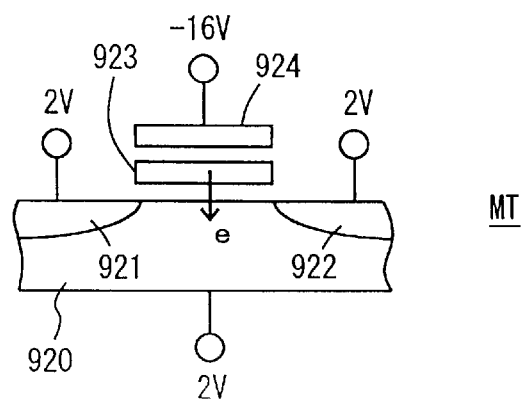
FIG. 22 shows an example of an applied voltage in extracting electrons from the gate of a flash memory cell.

First, in FIG. 1, when an erasure command is applied (step S1) or a lock command is applied (step SP1), read/write/erasure control circuit (915) set up a necessary power supply to generate a voltage shown in FIG. 22 (step S2). Next, an erasing bias is applied to target memory cells in either the erasing operation and the locking operation. When the erasing is carried out sector by sector in the application of the erasure command, a corresponding sector is erased collectively. When the lock is set (hereinafter referred to as "lock mode"), data in memory cells in a target row are erased in accordance with an address signal. This can easily be realized simply by validating an externally-applied address in application of the lock command (step S3).

Figure 2:
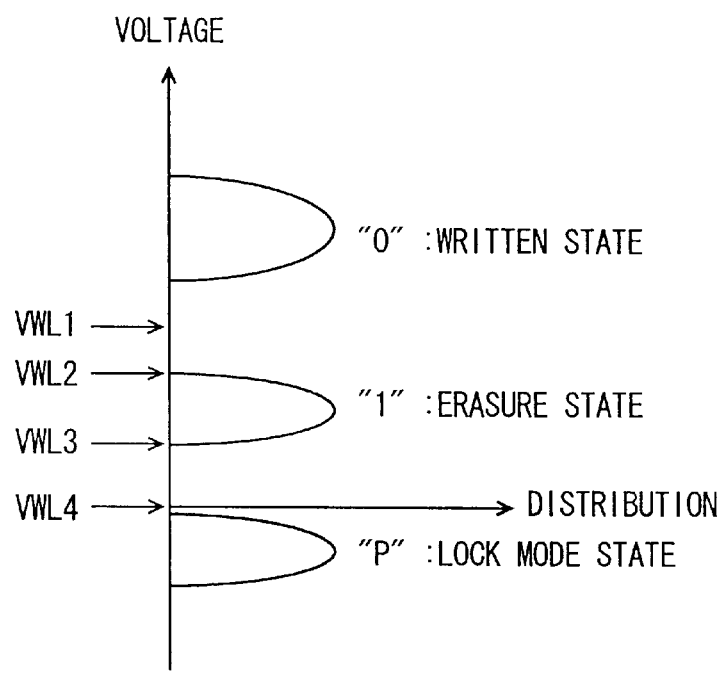
FIG. 2 shows the distribution of threshold voltages of memory cells according to the first embodiment of the present invention.

After the erasing bias is applied to the memory cells, an erasure verifying operation is required. In this state, it is determined whether or not the lock command is applied (step SP2). In a normal erasure mode, as in the conventional case, erasure verification voltage VWL2 (see FIG. 24) is applied as shown in FIG. 2, as an erasure verification voltage.

Whereas, in the lock mode, a voltage transmitted onto a word line (WL) is set to be at lock verification voltage VWL4. Lock verification voltage VWL4 is at a level of a non-selecting voltage transmitted onto a non-selected word line in data reading.

Subsequently, after setting of the word line voltage, the erasure verifying operation is executed (step S5). In the erasure verification, a preset word line voltage is transmitted to the word line of a locking target or the word line of an erasing target, and an internally-provided sense amplifier for verification (not shown) detects whether or not current flows in the bit line. If no current flows in the bit line, it is determined that the erasing operation is insufficient (step S6), and error determining processes of steps S7 and S8 are performed and thereafter application of the erasing bias is repeatedly executed until current flows in the bit line, as in the conventional case. If no bit-line current flows and no erasure state or lock state is attained after a predetermined number of times of application of the erasing bias, it is determined that an error occurred, and a necessary error process is executed (S9), as in the conventional case.

When the erasure verification of the target memory cells is carried out and all the target memory cells are rendered conductive in the erasure verifying operation, subsequently, it is again determined whether or not the lock mode is designated (step SP4). In the lock mode, the verification voltage is at the voltage level of non-selecting voltage VWL4 at the time of data reading, and the threshold voltages of the memory cells in the lock mode are at the voltage levels lower than non-selecting voltage VWL4 and are set within a region "P" shown in FIG. 2.

Therefore, in the lock mode, the target memory cells are set to be in a state where current always flows in a corresponding bit line irrespective of selection/non-selection of a corresponding word line, so that no check for over-erasure is required and the process of terminating the locking operation is executed (step SP5).

Whereas, in the normal erasing operation mode, the over-erasure is checked again using over-erasure verification voltage VWL3 as in the conventional case (steps S10 to S13). The memory cells in the locked state are in a so-called "over-erasure state."

Figure 3:
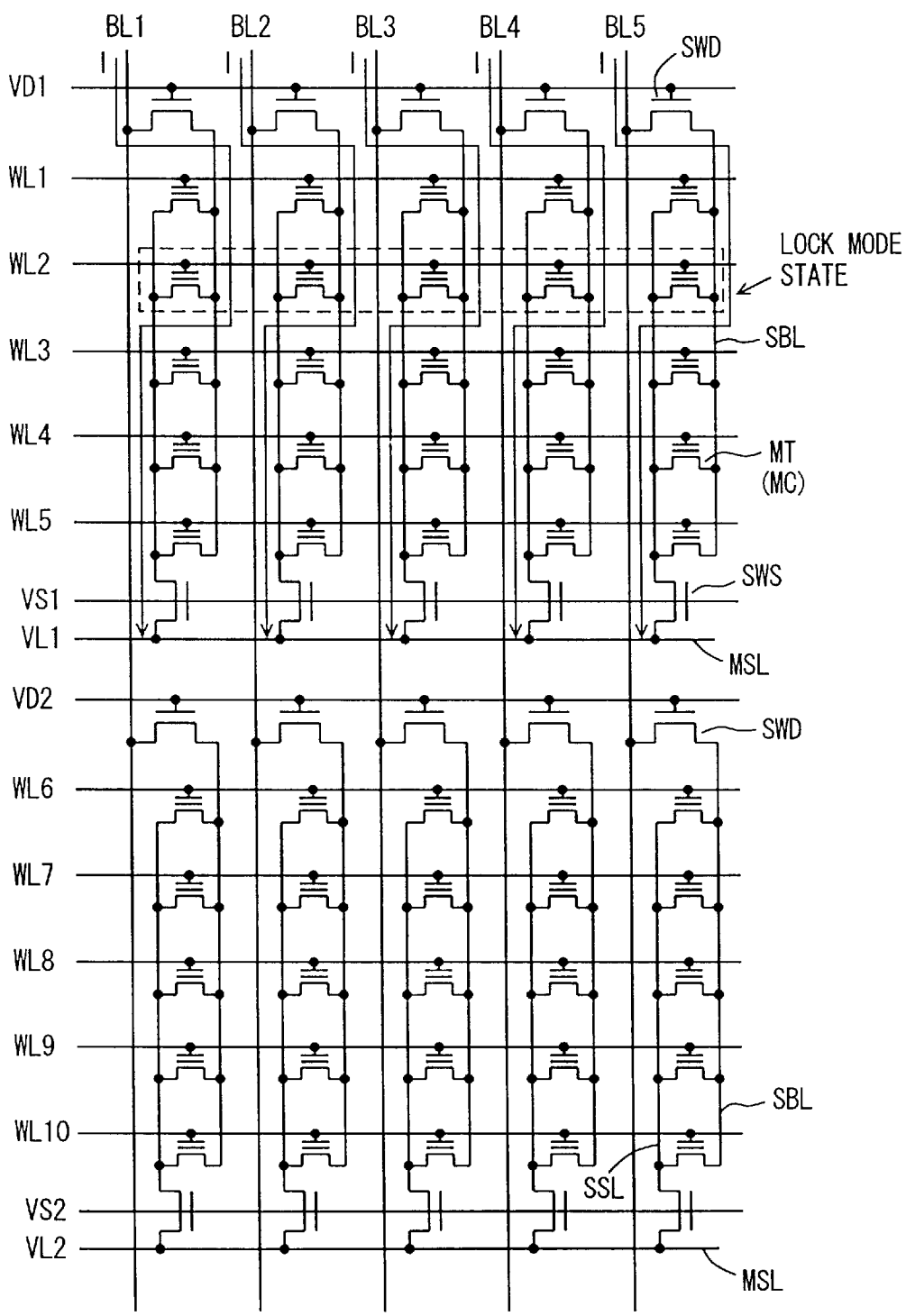
FIG. 3 shows a data reading state when the lock mode is set according to the first embodiment of the present invention.

FIG. 3 schematically shows bit-line current when the lock mode is applied to memory cells MC connected to word line WL2. The memory cells MC connected to word line WL2 are in the lock mode state, and the threshold voltages thereof are in the region "P" shown in FIG. 2. Thus, even if word line WL2 receives non-selecting voltage VWL4 in the data reading mode, corresponding memory cells MC are all conductive. If this sector is selected in accordance with sector selecting signals VD1 and VS1, current I flows in bit lines BL1 to BL5 via memory cells MC connected to word line WL2. Therefore, even if e.g. word line WL3 is selected, and selecting voltage VWL1 for reading is transmitted onto word line WL3 whereas non-selecting voltage VSL4 is transmitted onto the remaining word lines WL1, WL2, WL4 and WL5, current flows in these bit lines BL1 to BL5 by the memory cells MC connected to word line WL2. Therefore, it is determined that all the memory cells are in the erasure state and are storing data "1."

Thus, by setting the memory cells connected to the word line of a locking target to be in the "over-erasure state," data reading of the remaining word lines WL1, WL3 to WL5 are locked, so that the data stored therein cannot be read and therefore can be concealed from the outside.

In a flash memory having a configuration in which a plurality of memory cells are connected in parallel to the same bit line, such as an AND-type flash memory, when one memory cell in each column is set to be in the lock mode state, all the memory cells connected to the same bit line are recognized to be in the erasure state, making it impossible to read out the stored data. Therefore, the data within the same sector as word line WL2 in the lock mode state can be concealed from the outside, ensuring the security.

It is noted that a sector selected by sector selecting signals VD2 and VS2, i.e. the memory cells in word lines WL6 to WL10, can be read out for data. In this case, the sector selected by sector selecting signals VD1 and VS1 may exclusively used as a lock region. Further, when the data stored in a sector designated by sector selecting signals VD2 and VS2 is to be concealed from the outside, the lock mode is executed for a word line, of word lines WL6 to WL10, with any address. The address for the lock mode may be set individually by an actual user of a portable equipment or the like, and may be configured such that the lock mode is executed for the lock mode address set by the individual user when the lock command is applied. This can be performed simply by storing the address for the lock mode within an internal register and applying the address for the lock mode to an X-decoder when the lock command is applied. Moreover, the user may individually apply an address specifying a region to be set in the lock mode when the lock command is applied.

Note that the threshold voltage in the lock mode must be controlled to be lower than that in the normal erasure state. Thus, at the time of application of the erasing bias in the lock mode, such a process is executed that a higher potential difference is applied or that the bias is applied to the memory cells for a longer time period. This can easily be realized in the lock mode simply by changing the voltage at the time of power source voltage set-up in step S2 shown in FIG. 1 or by changing the time period for which the erasure bias is applied in the application of the erasing bias (step S3). This allows the memory cells to be rapidly driven to be in the lock mode state even if they are driven to the so-called "over-erasure state" in the lock mode.

Moreover, in the erasure verification in the lock mode (step S5), the erasure verification voltage is set such that the verification is carried out at a voltage lower than the normal read non-selecting voltage VWL4, so that the memory cells can more reliably be set to be in the "over-erasure state," and more reliable locking operation can be attained.

Furthermore, the data originally stored in the memory cells set in the lock mode state are lost in the lock mode, so that the data stored in the target memory cells may temporarily be saved in a register circuit in the lock mode, and the saved data may be re-loaded in the unlock mode for releasing the lock mode. Such a configuration can reduce the load on an actual user for managing addresses of a data-holding region in the lock mode. An arbitrary address can be set into the lock mode state without destruction of the stored data.

Figure 4:
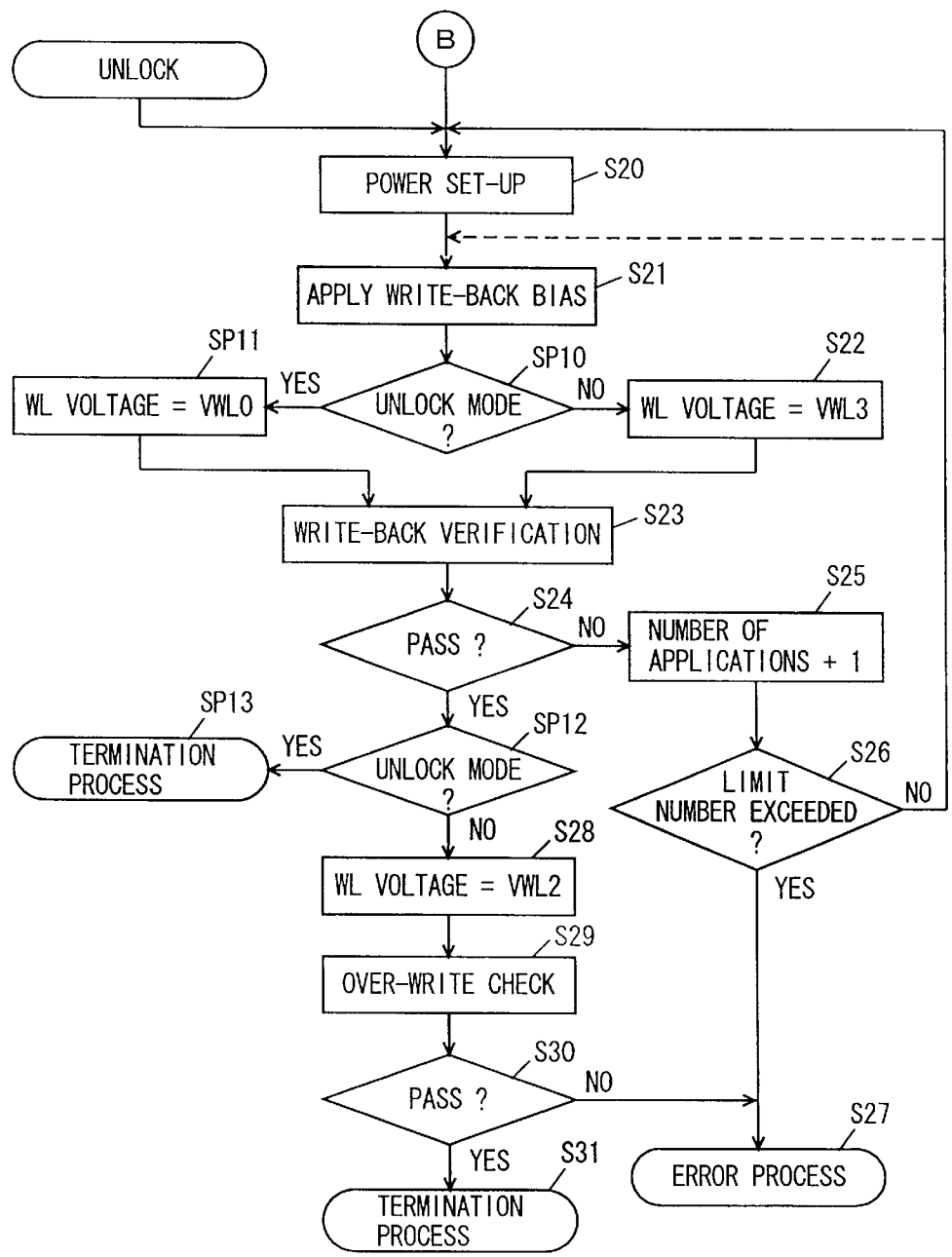
FIG. 4 is a flow chart representing a process procedure in an unlock mode according to the first embodiment of the present invention.

FIG. 4 is a flow chart representing the operation in the unlock mode that releases the locked state. In the unlocking operation, the write-back process procedure executed in the erasing operation as shown in FIG. 1 is utilized, and the steps corresponding to those in the conventional write-back process procedure are denoted by the same reference numerals.

Figure 21:
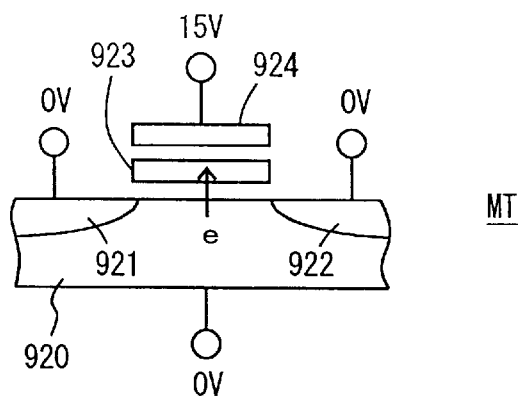
FIG. 21 shows an example of an applied voltage in injecting electrons into the floating gate of a memory transistor in a flash memory.

When an over-erasure state is detected or an unlock command is applied in the normal over-erasure verifying operation, a power supply is set up in order to execute the write-back (step S20). When the power supply is set up, a voltage as shown in FIG. 21 is generated in order to increase the threshold voltage of the memory cells in the over-erasure state.

Figure 24:
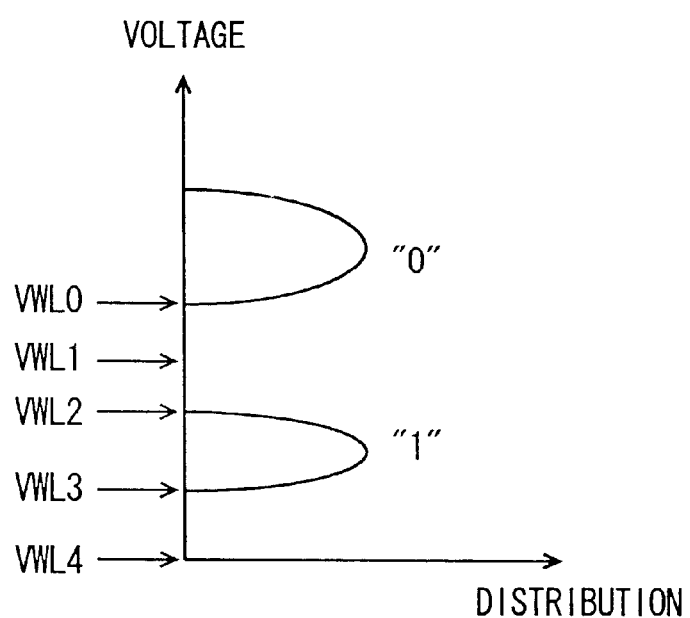
FIG. 24 shows a correspondence between the applied voltage to a word line and the threshold voltage of a memory cell.
Figure 25:
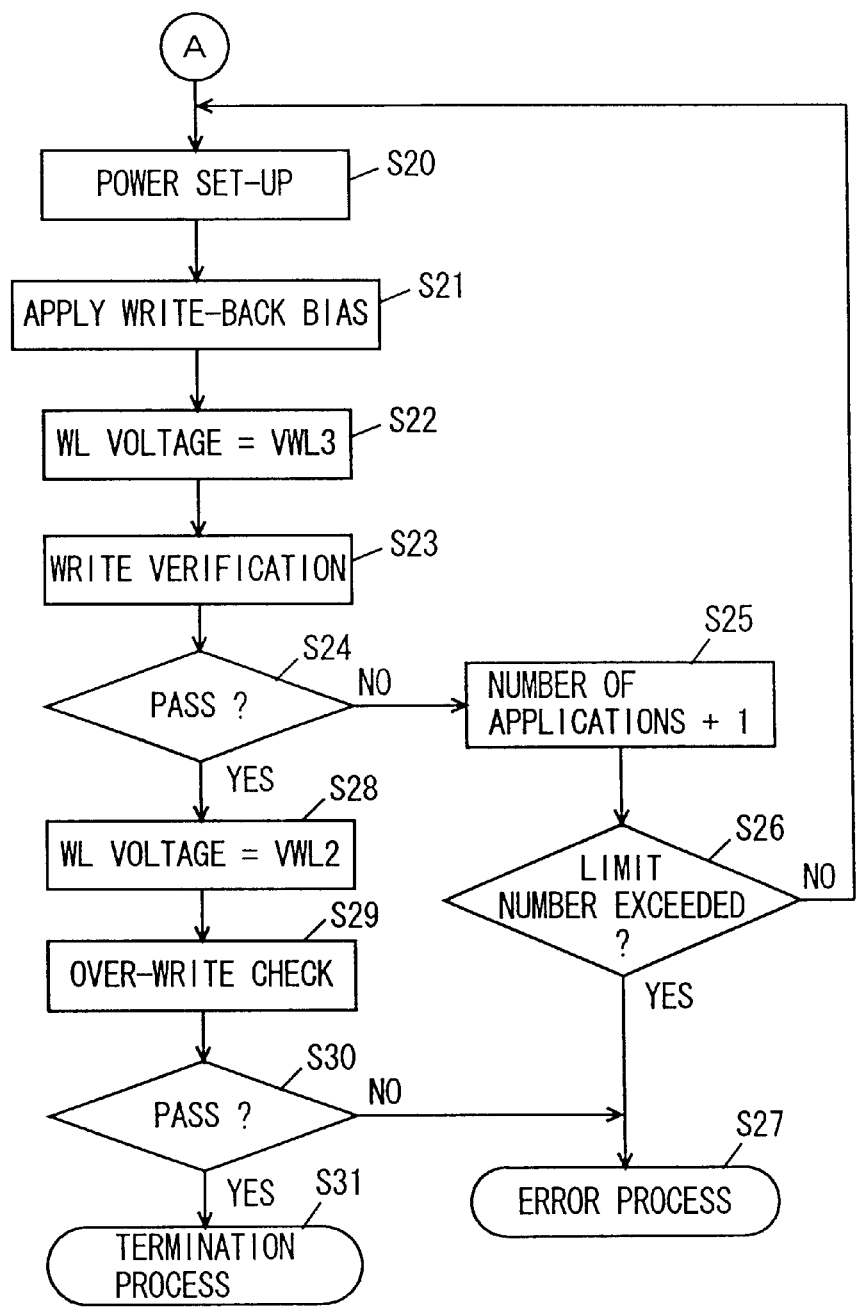
FIG. 25 is a flow chart representing a write-back process in the erasure process procedure for the conventional flash memory.

Subsequent to the power set-up, a row and a column are selected and a write-back bias is applied to the selected memory cells (step S21). Subsequently, it is determined whether or not the unlock mode is being set (step SP10). In a normal erasure mode, over-erasure verification voltage VWL3 is generated in step S22 as in the write-back process of the normal erasing operation, whereas in the unlock mode, an voltage VWL0 for unlocking is generated. Unlocking voltage VWL0 corresponds to the threshold voltage of the lower limit in the distribution of the threshold voltages in the written state, as shown in FIG. 24. After generation of these word line voltages, a write-back verifying operation is executed (step S23). That is, a row and a column are selected and an internal sense amplifier for verification detects whether or not current flows in the bit line.

In the write-back verification determining operation in step S24, current-flow in the bit line is detected. This is done to determine whether or not the threshold voltages of the memory cells are higher than the word line voltage. Therefore, in the unlock mode, the threshold voltage in the region "P" in FIG. 2 is moved to fall within the distribution region of the threshold voltages in the written state. If the current flows in the bit line in the determination step S24, meaning that the write-back or the unlock is insufficient, the write-back bias is repeatedly applied until no current flows in the bit line as in the conventional case (steps S25, S26).

In the determination step S24, if it is determined that the current no longer flows in the bit line and that the write-back is completed, subsequently, it is determined whether or not the unlock mode is designated (step S12). In the unlock mode, it is only required for the threshold voltages of the memory cells to be at least unlocking voltage VWL0 and no upper limit is required, so that the unlocking operation is terminated and the process required for terminating the unlocking operation is executed (step SP13).

On the other hand, in the normal erasing operation, the threshold voltages of the memory cells must be within the distribution of the threshold voltages in the erasure state, so that the processes from step S28 et seq. are executed as in the conventional case.

Thus, when the unlocking operation is completed, the memory cells in the lock mode are all in the written state, and corresponding memory cells are always maintain non-conductive irrespective of the state of the corresponding word line (WL2), i.e. whether the word line is selected or non-selected. Therefore, the data stored in the memory cells of the remaining word lines WL1, WL3 to WL5 can normally be read out.

When the unlock mode that releases the lock mode is executed, the unlock mode must be executed for the same memory cells as the ones to which the lock mode was executed. If the unlock mode was executed for the memory cells in a state different from the lock mode state, the state of the memory cells in the lock mode state would not change, so that the locked state could not be released. Further, in such a case, contents stored in the memory cells to which the unlock mode is executed would all be in the written state, losing the data contents originally stored therein.

It is noted that, when the number of times of applications of the write-back bias does not exceed the limit number, the process may go back to step S21 as indicated by the broken line in FIG. 4, not going back to the power set-up in step S20 in FIG. 4.

Note that, in the process procedure for the unlock mode is realized utilizing the sequence of the write-back process procedure. However, as will be described later, the unlock mode may be executed utilizing the process procedure for normal writing. In such a case, however, the write data for the memory cells to be unlocked must be all set at "0" corresponding to the write state.

Modification

Figure 5:
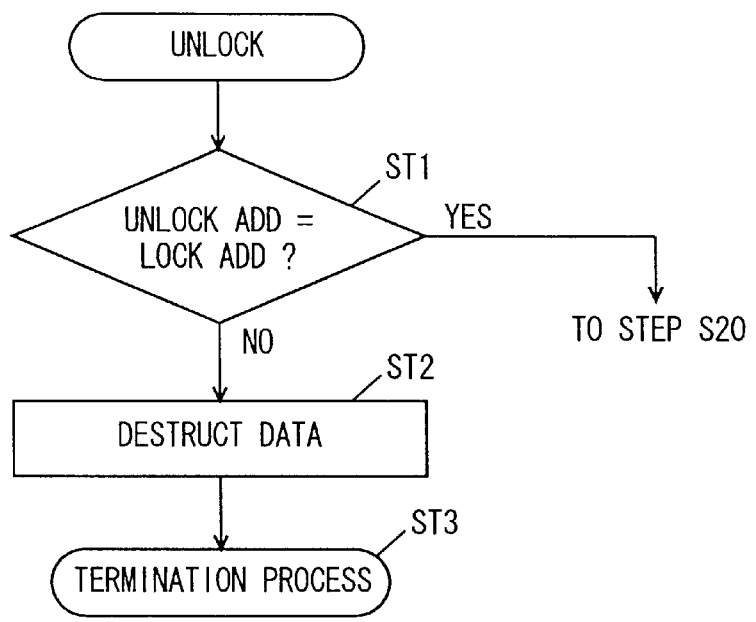
FIG. 5 shows a process procedure of a modified example according to the first embodiment of the present invention.

FIG. 5 shows a process procedure of an unlocking operation in a modification of the first embodiment of the present invention. In FIG. 5, when the unlock command is applied, it is determined whether or not an unlock address (ADD) specifying the unlocking target is consistent with a lock address (ADD) specifying the memory cells in the lock mode state (step ST1). If the unlock address is equal to the lock address, the process moves on to step S21 shown in FIG. 4, and the unlocking operation process is executed subsequently.

On the other hand, if the unlock address is unequal to the lock address, the data stored in the memory cells are destructed (step ST2). As for the data destruction, the stored data in the entire flash memory may all be in the erased state or only the stored data within the lock sector may be erased.

After the data destruction, a necessary process is executed to notify the outside that all the data are erased, for example, (step ST3).

Thus, even if others execute the unlock mode, reading of the stored data can be prevented, and therefore the confidentiality of data can be maintained.

Note that such a configuration may be employed that the data is destructed when an incorrect unlock address is provided a predetermined number of times in the processing operation of data destruction.

The lock address applied at the application of the lock command is stored into an internal register circuit or into a non-volatile memory circuit, and is read out when the unlock command is applied, to be compared to the unlock address.

Alternatively, first, the lock address may initially be set by an individual user to the register circuit preferably constituted by a specific non-volatile memory circuit as described above, and thereafter memory cells on a corresponding word line may be set into the lock mode in accordance with the lock address stored in the register circuit each time the lock command is applied. In this case, the individual user applies an unlock address at the application of the unlock command. This is configured such that the data writing (storing) to the lock address stored in the specified register circuit is inhibited (for example, the region designated by this lock address is skipped for data storing).

Also in this case, no special circuit is provided in a hardware manner for ensuring the security, since the individual user initializes the lock address. Therefore, even if the chip is disassembled and a mask pattern is analyzed, the lock address cannot be decoded, since it is arbitrary.

Moreover, the data concealing function can easily be realized only by partly adding/correcting the erasure/write process sequence executed by the sequence controller of the read/write/erasure control circuit, without any addition of a new circuit to an existing AND-type flash memory.

Second Embodiment

Figure 6:
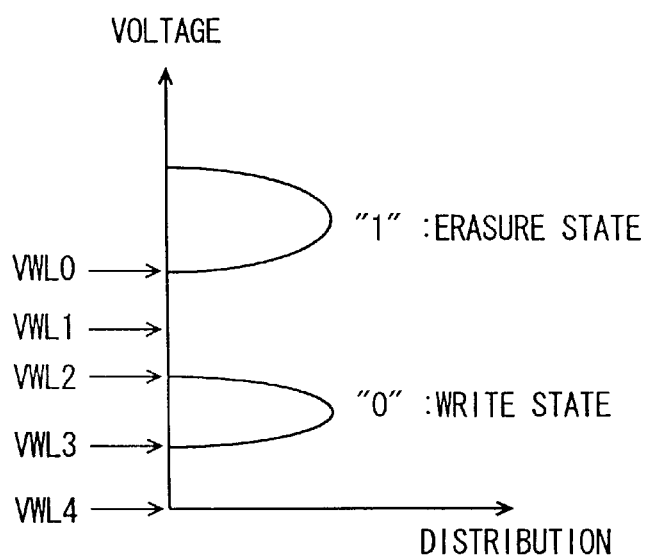
FIG. 6 shows the distribution of threshold voltages of memory cells according to the second embodiment of the present invention.

FIG. 6 shows a correspondence relationship between the distribution of the threshold voltage and the stored data of a flash memory according to the second embodiment of the present invention. As shown in FIG. 6, in the second embodiment of the present invention, if a memory cell has a high threshold voltage, the memory cell is referred to as being an erased state, storing data "1." On the other hand, if the memory cell has a low threshold voltage, the memory cell is referred to as being a written state, storing data "0." Such a flash memory having a configuration that the erased state corresponds to the high-threshold state includes, for example, a DINOR-type flash memory. Even if the relationship between the threshold voltage and the stored data is different from that in the first embodiment, the lock mode can similarly be set utilizing the writing process procedure, in which the process of increasing the threshold voltage and the process of reducing the threshold voltage are now referred to as an erasing operation and a writing (programming) operation, respectively.

Figure 7:
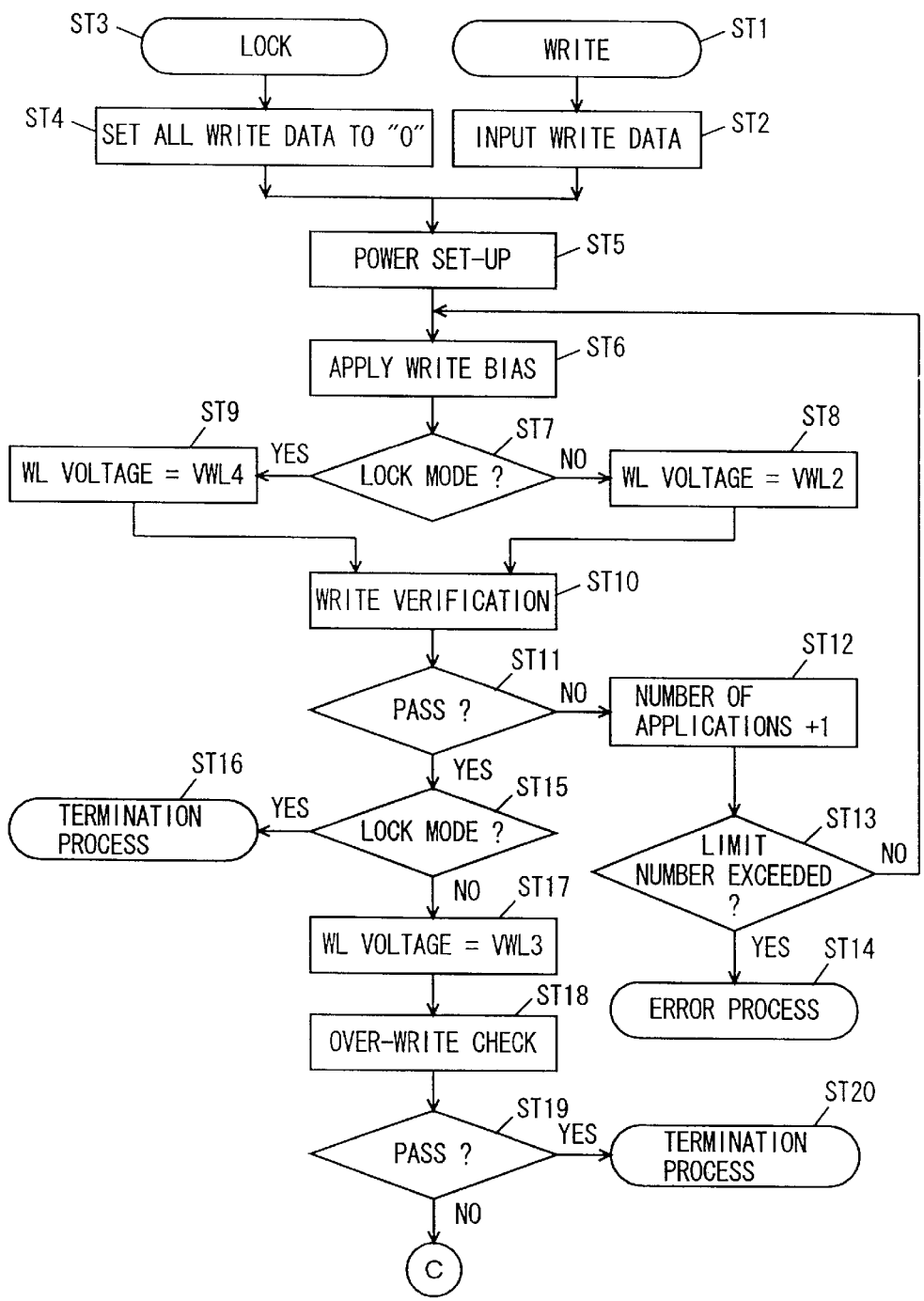
FIG. 7 is a flow chart representing a process procedure in the lock mode according to the second embodiment of the present invention.

FIG. 7 is a flow chart representing a process procedure in the lock mode of the flash memory according to the second embodiment of the present invention.

In FIG. 7, when data writing is carried out, a write command instructing the data writing is applied (step ST1), and subsequently, write data are applied (step ST2). The write data are sequentially stored into the data register previously shown in FIG. 18.

In the lock mode, a lock command is applied (step ST3), and all the write data are set at "0" in accordance with the lock command (step ST4). This is achieved by, for example, forcibly setting the data stored in the data register to be "0" or forcibly setting a write data input driver for generating internal write data to be in a "0" output state. The data "0" corresponds to the written state, and thus the memory cells are set in a state with a low threshold voltage. The lock address may externally be applied together with the lock command, or may be pre-stored internally.

When these steps ST2 and ST4 are completed, a voltage required for writing is generated (step ST5). In the writing, the memory cells are set to be in the low-threshold state, so that a voltage at which electrons are extracted from the floating gate is generated.

Subsequently, memory cells are selected in accordance with an address signal, and a writing bias is applied to the selected memory cells (step ST6). The writing bias allows the electrons in the selected memory cells to be extracted from the floating gate of the selected memory cells.

Before a verifying operation, first, it is determined whether or not the lock mode is designated (step ST7). In the normal writing operation mode, the voltage transmitted to the word line is set to be at voltage VWL2 (step ST8), whereas in the lock mode, the voltage transmitted onto the word line is set to be at voltage VWL4. Write verification voltage VWL2 corresponds to the threshold voltage of the upper limit in the distribution of the threshold voltage in the written state, whereas lock voltage VWL4 is at the level of a read non-selecting voltage. The write verification is executed with these voltages VWL2/VWL4 used as verification voltages (step ST10). In the write verification, memory cells are selected and it is detected whether or not the write data applied from the outside corresponds to the data read from the memory cells.

In the write verifying operation, if the write data and the internal read data are inconsistent with each other, it is determined that the threshold voltage of the memory cells storing data "0" is not low enough and that the memory cells are not yet in the written state. Then, the number of times of writing bias application is incremented by one in order to apply the writing bias again (step ST12). Subsequently, it is determined whether or not the number of times of writing bias application exceeds a limit number (step ST13). If the writing bias has been applied a predetermined number of times, it is determined that normal writing cannot be carried out, and a necessary error process is executed (step ST14). On the other hand, if the number of times of application of the writing bias has not reached the predetermined number of times, the process goes back to step ST6.

If it is determined in the determination step ST11 that the write data are all set to be in the state corresponding to the input data, subsequently, it is determined whether or not the lock mode is designated (step ST15). In the determining operation for pass/fail in step ST11, whether or not current flows in the bit line corresponding to a register circuit storing data "0" in accordance with the data stored in the data register is detected. In this case, such a simple configuration may be possible that consistence/inconsistency in logic of the write data and the internal read data is externally determined.

In the lock mode, it is only required for all the memory cells of the locking target to be set in the high-threshold state, and no upper limitation is required for the range of the threshold voltage. Therefore, the process of terminating the lock mode is executed (step ST16).

In the normal write mode, in order to again determine whether or not the threshold voltages of the memory cells are within the distribution region of the threshold values in the written state shown in FIG. 6, the voltage to be transmitted onto the word line is set at voltage VWL3. Voltage VWL3 corresponds to the lower limit of the distribution of the threshold voltages in the written state (step ST17). Using voltage VWL3, verification is performed to determine whether or not the excessive writing (over-writing) is caused (step ST18). In this determining operation, the check for the over-writing is executed by determining whether or not current flows in the bit line. In step ST19, if threshold voltages of all the memory cells are at or higher than the over-erasure verification voltage, the data writing operation is completed.

On the other hand, if an over-written cell exists, an erase-back process for increasing the threshold voltage of the over-written memory cell is executed.

Thus, at the completion of the lock mode, the threshold voltages of the memory cells of the locking target are low enough to be lower than non-selecting voltage VWL4 on the word line, so that the memory cell is always in an ON state, and hence the data stored in the memory cells other than the target memory cells to be locked can be concealed from the outside, as in the previously-described first embodiment.

As described above, in the second embodiment, in a flash memory in which the written state corresponds to the low-threshold state, the lock mode is executed using the write process procedure. Therefore, the data concealing function can easily be realized using existing circuitry only by partly adding/correcting the process sequence. The memory cells are in the same state as in the configuration shown in FIG. 3, in which the memory cells in the lock mode state are always in the ON state, so that current always flows in the bit line, preventing the data stored in the other memory cells from leaking out.

Figure 8:
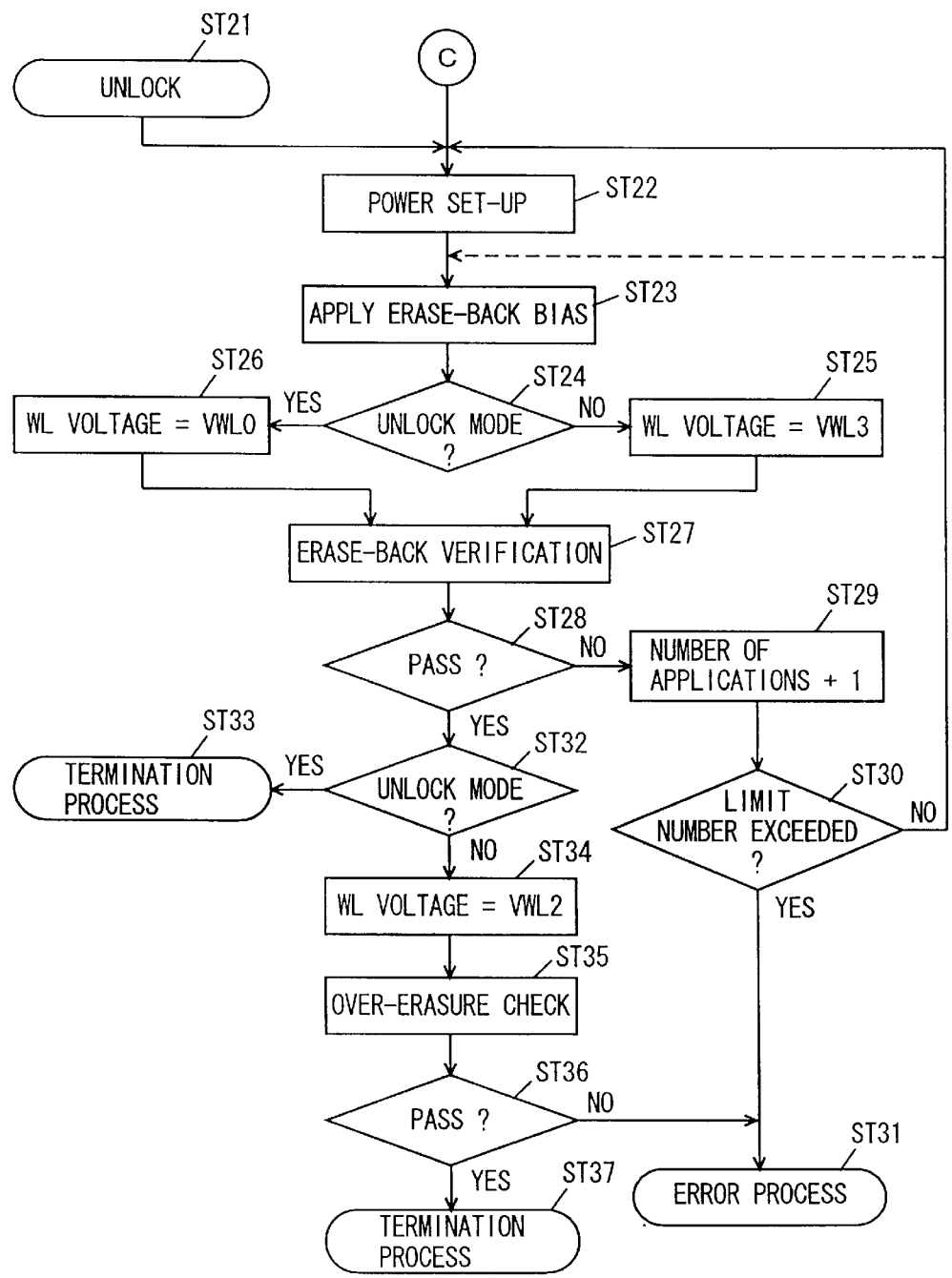
FIG. 8 is a flow chart representing a process procedure in the unlock mode according to the second embodiment of the present invention.

FIG. 8 is a flow chart representing a process procedure in the unlock mode according to the second embodiment of the present invention. As shown in FIG. 8, the process procedure in the unlock mode according to the second embodiment of the present invention utilizes the erase-back process procedure of the writing operation.

In FIG. 8, when the check for over-writing (excessive writing) is terminated or an unlock command is applied (step ST21), a power-supply is started (set up) to generate a required voltage. When the power-supply is set up, the voltage required for the memory cells to return to the written state shown in FIG. 6 is applied in order to carry out the erase-back. That is, a voltage similar to that in the erasing operation is applied to the target memory cells (the memory cells in the over-erasure state) (step ST22).

Subsequently, using the voltage generated in the high voltage generating circuit, a row and a column are selected and an erase-back bias is applied for a predetermined time period (step ST23). Subsequent to the application of the erase-back bias, it is determined whether or not the unlock mode is designated (step ST24). In a normal erase-back operation, a voltage transmitted onto a word line is set at voltage VWL3 in order to determine if the target memory cells (the memory cells storing data "0") are returned to the written state (step ST25). The erase-back verification voltage VWL3 is equal to the lower limit in the distribution of the threshold voltages in the written state, as shown in FIG. 6. If the unlock mode is designated, the voltage transmitted onto the word line is set at voltage VWL0. The unlocking voltage VWL0 corresponds to the lower limit in the distribution of the threshold voltages in the erasure state, as shown in FIG. 6.

Subsequent to the setting of the word line voltage, an erase-back verifying operation is executed (step ST23). That is, a row and a column are selected, a preset voltage is transmitted to word line WL, and data reading is carried out using an internal sense amplifier for verifying.

Next, it is determined whether or not current flows in the bit line (step ST28). If current flows in the bit line, meaning that a memory cell in the over-written state still exists, the erase-back is again executed. That is, the number of times of application of the erase-back bias is incremented by one at a counter (not shown) (step ST29), and subsequently, it is determined whether or not the number of application times of the erase-back bias exceeds the limit number (step ST30). If the number of application times of the erase-back bias is no more than the limit number, the process goes back to step ST22 and the subsequent operation steps are executed. In the re-erase-back process, the process may go back from step ST30 to step ST23, and the erase-back operation may be restarted from the operation of applying the erase-back bias simply by maintaining the power set-up state (this route is shown in the broken line).

If the number of times of application of the erase-back bias exceeds a predetermined limit number, it is determined that the over-written state cannot be dissolved, and a necessary error process is executed (ST31).

If the erase-back is completed, subsequently, it is determined whether or not the unlock mode is designated (step ST32). If the unlock mode is designated, in which there is no upper limit for the threshold voltages of the memory cells, the memory cells are only required to always maintain non-conductive, irrespective of the voltage level of a corresponding word line. Thus, and a process for terminating the unlock mode is executed (step ST33). In the process of terminating the unlock mode, the set up power-supply is reset, or an instruction for releasing the lock mode is applied to an external processing device.

On the other hand, in the normal writing operation, the word line voltage is first set to be at voltage VWL2 in order to determine whether or not the over-erasure occurs due to the erase-back. Over-erasure verification voltage VWL2 corresponds to the voltage at the upper limit in the distribution of the threshold voltages in the written state, as shown in FIG. 6. Subsequently, a row and a column are selected and over-erasure verification voltage VWL2 is transmitted to the word line in the selected row for internally executing reading of data (step ST35). Then, it is determined whether or not current flows in a bit line to which the memory cells storing data "0" is connected, in accordance with write data, or whether or not the write data and the stored data are consistent with each other. If the data are inconsistent or if no current flows in the corresponding bit line, it is meant that the memory cells are back to be in the over-erasure state. Thus, it is determined that no normal data writing can be performed to the corresponding memory cell, so that the process moves on to step ST31 and a necessary error process is executed.

If current flows in the bit line corresponding to the memory cells to which data "0" is written, it is determined that the memory cells in the over-erasure state are normally returned to the written state, and a necessary process for terminating the entire writing operation is executed (step ST37).

It is noted that, in the erase-back process, the erase-back verifying and the over-erasure checking operations are carried out for memory cells in the over-erasure state as a target. When the unlock mode command is applied, an external address is validated instead of an address specifying the memory cells in the over-erasure state, and the erase-back bias is applied.

When the unlocking is completed, all the memory cells that were in the lock mode state are set to be non-conductive, and hence the data in the other memory cells can be read out externally.

The unlock mode also utilizes the procedure of the erase-back process in the normal writing operation, simply releasing the lock mode in a software manner, so that there is no need to provide a new dedicated circuit. Therefore, as in the first embodiment, the data concealing function can easily be realized by adding/correcting a part of an existing write process sequence.

Third Embodiment

Figure 9:
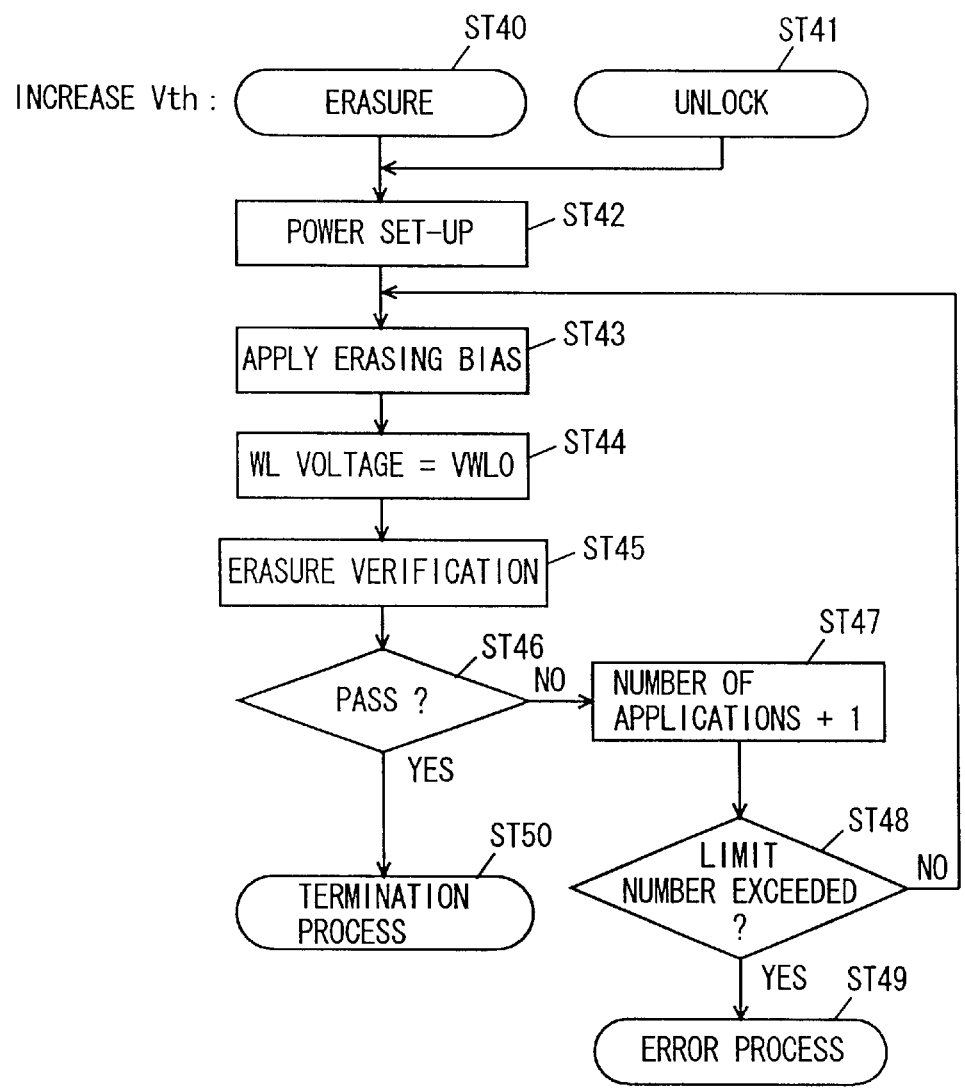
FIG. 9 is a flow chart representing the process procedure in the unlock mode according to the third embodiment of the present invention.

FIG. 9 represents a procedure of an unlock process for a flash memory according to the third embodiment of the present invention. In the flash memory shown in FIG. 9, the erasure state corresponds to a state where the threshold voltage is higher than that in the written or programmed state (see FIG. 6).

First, referring to FIG. 9, when an erasure command is applied (step ST40) or an unlock command is applied (step ST41), a power-supply is set up and a necessary voltage is generated (step ST42). The erasure state is a state with a high threshold voltage, so that the voltage shown in e.g. FIG. 21 is generated from a high voltage generating circuit.

Subsequently, an erasing bias is applied to target memory cells (step ST43). In the erasing operation, in a configuration where flash or collective erasure is executed sector by sector, when the unlock command is applied, a sector address for unlocking and a row address for designating an unlock word line that are applied together with the unlock command are validated, and erasure is executed in a so-called page unit. After the erasing bias is applied to the target memory cells, the voltage to be transmitted to the word line is set to be at erasure verification voltage VWL0 for performing erasure verification (step ST44). The erasure verification voltage VWL0 is at the same voltage level both in the erasing operation and in the unlocking. Subsequently, the erasure verifying operation for the target memory cells are executed, internal reading of data is carried out, and then it is determined whether or not current flows in a bit line (steps ST45 and ST46). If a target memory cell has not yet been in the erased state and current still flows in the associated bit line, the number of times of application of the erasing bias is incremented by one in order to execute the erasing operation again (step ST47). Subsequently, it is determined whether or not the number of times of application of the erasing bias exceeds a limit number (step ST48). If the number of times of application of the erasing bias exceeds the limit number, it is determined that no erasure can be performed at all, and hence a necessary error process is executed (step ST49). If the number of times of application of the erasing bias is no more than the predetermined limit number, the process goes back to step ST43, and the erasure-bias applying operation and the erasure verifying operation are repeatedly executed.

In step ST46, on the other hand, if it is determined that all the target memory cells are in the erased state as a result of the erasure verifying operation, the erasing operation is terminated and a necessary termination process such as resetting of the power-supply is executed (step ST50). In the erasing operation and the unlocking operation, it is only required for the memory cells to be set in the high-threshold state, and there is no need for the over-erasure verification.

Thus, in the process procedure shown in FIG. 9, when the erasing operation is performed along flash erasure, the row address for designating a word line for unlocking is validated and the target word line for unlocking is selected by an X-decoder. This is simply performed by invalidating control signals, in the unlock mode, for the X-decoder, which cause the X-decoder to drive all the word lines within the sector to be in the selected state in the erasure mode. Thus, the procedure of the unlocking operation process can easily be implemented by utilizing the procedure of an erasing operation process similar to that used for the flash memory in which data are erased in a so-called page unit (word line unit).

For a configuration in which the flash erasure is performed sector by sector, using FN tunneling current flowing between a substrate region and a floating gate, the unlocking operation can be similarly performed utilizing the erasing process procedure, by driving a word line corresponding to an unlock address into a selected state.

Figure 10:
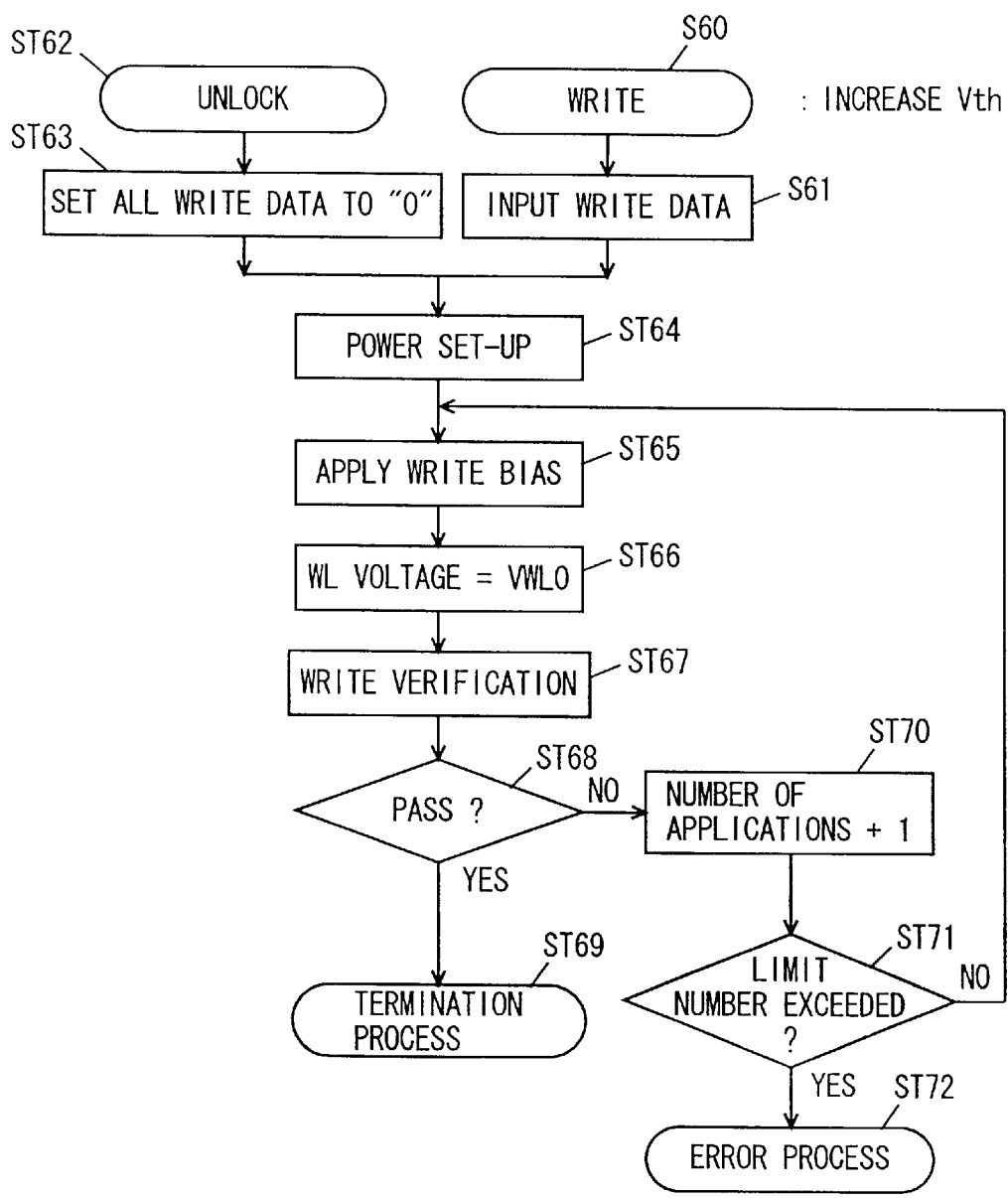
FIG. 10 is a flow chart represeting a modified example in the unlock mode according to the third embodiment of the present invention.

Modification:

FIG. 10 is a flow chart representing an unlocking operation process procedure in a modification of the third embodiment of the present invention. In the process procedure shown in FIG. 10, the written state corresponds to a state with a threshold voltage higher than that in the erasure state, and thus the unlocking operation is executed using the write process procedure.

Referring to FIG. 10, a write command is first applied (step S60), and write data is subsequently applied (step S61). Whereas, in the unlock mode, an unlock command is applied together with an unlock address specifying target memory cells for unlocking (step ST62). When the unlock command is applied, all the write data are internally set to be "0." Here, the written state corresponds to a state where data "0" is stored.

When the write command or the unlock command is applied, a power-supply is set up to generate a voltage required for writing (step ST64).

Next, a writing bias is applied to memory cells to which data "0" is written according to the write data (step ST65). No write bias is applied to memory cells to which data "1" is written, so that the memory cells maintain to be in the erased state. When the writing operation is completed, a voltage to be transmitted to a word line is set to be at a write verification voltage VWL0 in order to execute a verifying operation (step ST66). The write verification voltage corresponds to the lower limit of the distribution of the threshold voltages corresponding to the written state. Subsequently, write verification voltage VWL0 is transmitted onto the selected word line, and a row and a column are selected for internal data reading, and the data is internally read out (step ST67). Next, it is determined whether or not the internally-read data is consistent with the write data (step ST68). If the data internally read from the memory cells are all consistent with the write data, the writing or unlocking operation is completed, and a necessary termination process is executed (step ST69).

On the other hand, if write data and the data stored in the memory cells are inconsistent with each other, the number of times of application of the writing bias is first incremented by one in order to perform the writing again (step ST70). Subsequently, it is determined whether or not the number of times of application of the writing bias exceeds a limit number (step ST71). If the number of times of application of the writing bias exceeds a predetermined number, it is determined that writing operation cannot be normally performed to the target memory cells, and a necessary error process is executed (step ST72). On the other hand, the number of applications of the write bias has not yet reached the limit number, the process goes back to step ST65, and the writing bias is applied again, and then the write verifying operation is performed.

In a case where the write process procedure for increasing the threshold voltage is utilized, a required process procedure is merely a process of forcibly setting all the write data to be "0" when the unlock command is applied, and there is no need to particularly change the verification voltage. In the other unlock mode process procedure, all the writing process procedure can be utilized, so that the data concealing function can be realized using an existing erasure/write process sequence without addition of any additional dedicated circuit.

Fourth Embodiment

Figure 11:
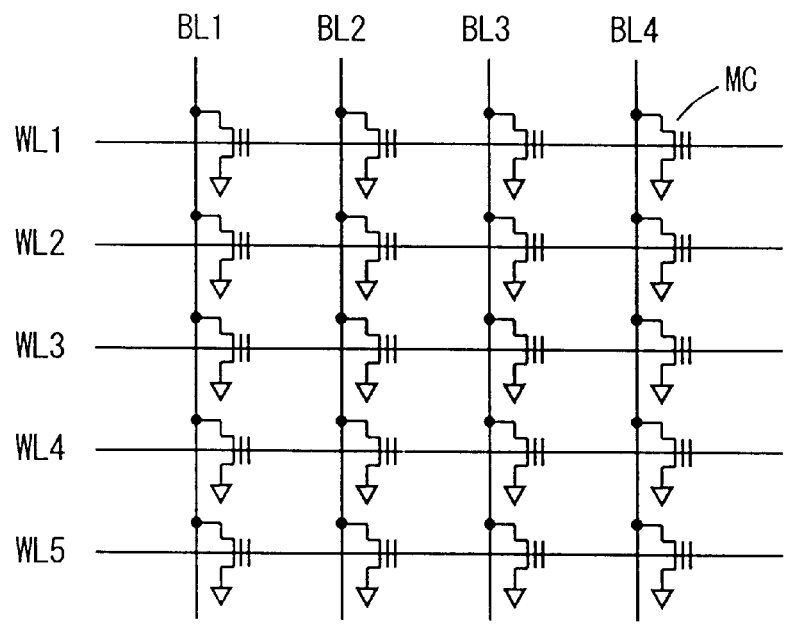
FIG. 11 shows a configuration of an array portion of a flash memory according to the fourth embodiment of the present invention.

FIG. 11 schematically shows a configuration of an array portion of a flash memory according to the fourth embodiment of the present invention. In FIG. 11, memory cells MC are arranged in a matrix of rows and columns. A word line WL (WL1 to WL5) is arranged corresponding to each row of the memory cells MC, and a bit line BL (BL1 to BL4) is arranged corresponding to each column of the memory cells MC. The flash memory shown in FIG. 11 is an NOR-type flash memory, and memory cells MC are connected in parallel to each bit line BL (BL1 to BL4). In the NOR-type flash memory, any corresponding relationship may be employed between the high-threshold state and the low-threshold state, and the written state and the erased state.

Figure 12:
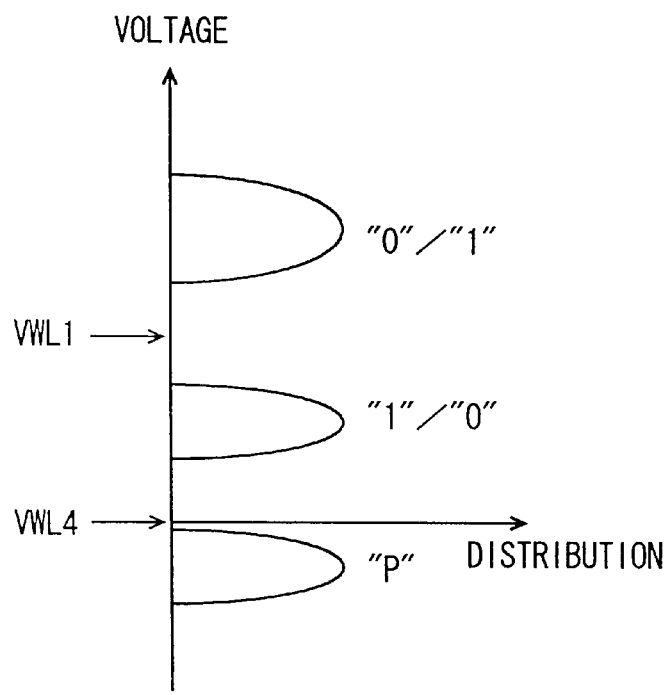
FIG. 12 shows the distribution of threshold voltages of memory cells in the flash memory shown in FIG. 11.

FIG. 12 schematically shows the distribution of the threshold voltages of memory cells according to the fourth embodiment of the present invention. In FIG. 12, the high-threshold state may be correlated with a state where data "0" is stored and the low-threshold state may be correlated with a state where data "1" is stored. Alternatively, the high-threshold state may be correlated with the state where data "1" is stored and the low-threshold state may be correlated with the state where data "0" is stored.

In either relationship, the threshold voltages of memory cells in the lock mode are only required to be lower than read non-selecting voltage VWL4 that is applied to a non-selected word line in data reading. In FIG. 12, the distribution region of the threshold values of memory cells in the lock mode state is indicated by a region "P."

The process procedure for setting the lock mode is executed using a process procedure of performing the operation for reducing the threshold voltages of the memory cells. Any one of the first and the second embodiments described earlier may be utilized.

In the NOR-type flash memory, memory cells MC in the same column are all connected to a common bit line BL (BL1 to BL4). Thus, when the memory cells in one row are set to be in the lock mode state, the data in the memory cells connected to the same bit line could not be read out. That is, once the memory cells enter into the lock mode, all the data reading will be impossible.

For the unlock process procedure, a process procedure for increasing the threshold voltage of memory cells, i.e. any one of the process procedures in the first to the third embodiments may be utilized.

As described above, the data concealing function may also be accomplished in the NOR-type flash memory by adding/correcting a part of an existing erasure/write process sequence without addition of any new circuit.

Fifth Embodiment

Figure 13:
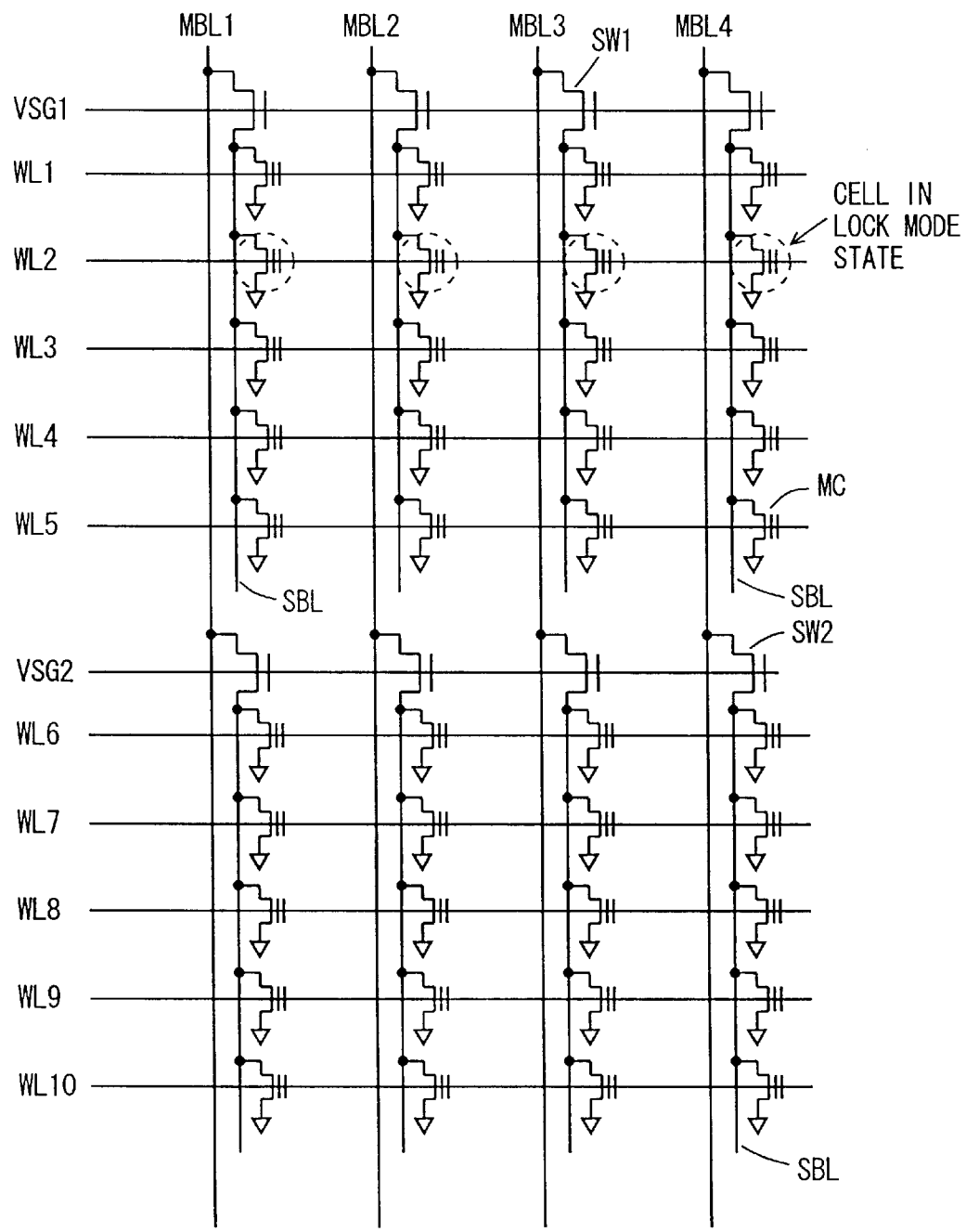
FIG. 13 shows an array portion of a DINOR-type flash memory according to the fifth embodiment of the present invention.

FIG. 13 shows a configuration of an array portion of a DINOR-type flash memory according to the fifth embodiment of the present invention. In the DINOR (DIvided bit line NOR)-type flash memory, memory cells MC are also arranged in a matrix of rows and columns. A main bit line MBL (MBL1 to MBL4) is arranged corresponding to each column of memory cells MC, and a word line WL (WL1 to WL10) is arranged corresponding to each row of memory cells MC.

In each column, a sub bit line SBL is arranged for each predetermined number of memory cells MC, and connected to a corresponding main bit line via a sector selecting transistor SW (SW1, SW2). A sector selecting signal VSG1 is applied to sector selecting transistor SW1 and a sector selecting signal VSG2 is applied to sector selecting transistor SW2.

In each column, memory cells MC are connected in parallel between a corresponding sub bit line SBL and a ground line (source line).

In the DINOR-type flash memory, the number of memory cells connected to main bit line MBL is limited to the number of memory cells connected to sub bit line SBL, so that the parasitic capacitance of bit line MBL is reduced, enabling fast reading of data.

In the DINOR-type flash memory shown in FIG. 13, any correspondence relationship may also be possible between the high-threshold/low-threshold states and the write/erasure states. The distribution of the threshold voltages of memory cells MC is the same as that shown in FIG. 12. Thus, by setting the threshold voltages of the memory cells in the lock mode state lower than read non-selecting voltage VWL4 supplied onto the non-selected word line in data reading, reading of data in the other memory cells connected to the same sub bit line SBL is made impossible.

For example, in FIG. 13, when the memory cells connected to word line WL2 are set to be in the lock mode state, reading of data of the memory cells MC in the sector selected by sector selecting signal VSG1, i.e. the memory cells MC connected to word lines WL1, WL3 to WL5 is impossible.

When any of word lines WL6 to WL10 is selected, sector selecting signal VSG1 is at a logic low or an L level and sector selecting transistor SW1 is non-conductive, isolating the memory cells in the lock mode state from the main bit line, so that the data in the memory cells connected to these word lines WL6 to WL10 can be read out. To lock the reading of the data stored in the memory cells connected to word lines WL6 to WL10, the memory cells of an arbitrary word line out of word lines WL6 to WL10 may be set to be in the lock mode state.

Therefore, in the DINOR-type flash memory, data in a specific address region can be concealed from the outside in a sector unit so as not to be read out.

Thus, also in the DINOR-type flash memory, the data concealing function can be accomplished with addition and modification of a part of an existing normal erasure/write process sequence without any addition of a new dedicated circuit.

For setting the lock mode and the unlock mode, any one of the process procedures in the first to the third embodiments may be utilized. The process procedure may appropriately be selected in accordance with the correspondence relationship between the threshold voltage and the write/erasure state of the DINOR-type flash memory.

Sixth Embodiment

Figure 14:
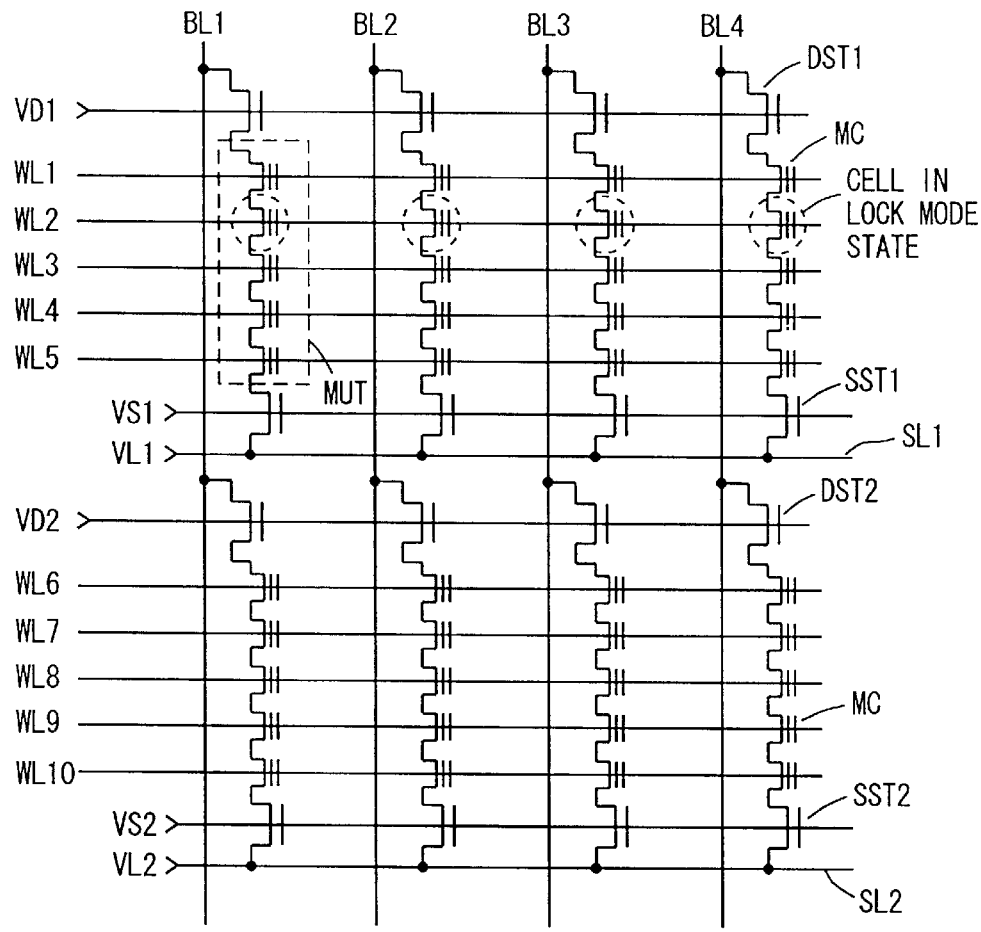
FIG. 14 shows a configuration of an array portion of an NAND-type flash memory according to the sixth embodiment of the present invention.

FIG. 14 shows a configuration of an array portion of an NAND-type flash memory according to the sixth embodiment of the present invention. In FIG. 14, a bit line BL (BL1 to BL4) is arranged corresponding to each column of memory cells MC. A predetermined number of memory cells are connected in series, and coupled to a corresponding bit line BL and a corresponding source line SL (SL1, SL2). A unit of memory cells MC connected in series (a memory unit MUT) is connected to a corresponding bit line BL via a sector selecting transistor DST (DST1, DST2), and is connected to a corresponding source line SL (SL1, SL2) via a sector selecting transistor SST (SST1, SST2).

In the NAND-type flash memory, in data reading, a word line WL (WL1 to WL10) is supplied with a high voltage as read non-selecting voltage VWL4 when non-selected, and memory cells MC on the non-selected word line are set to be conductive, irrespective of the stored data. A read voltage is applied to the selected word line, and the memory cells connected to the selected word line are selectively made conductive or non-conductive in accordance with the stored data. Thus, in data reading, as in the case for the other flash memories, bit line BL (BL1 to BL4) is electrically coupled to the ground via source line SL (SL1, SL2), and data is read out by detecting whether or not current flows in the bit line BL.

Figure 15:
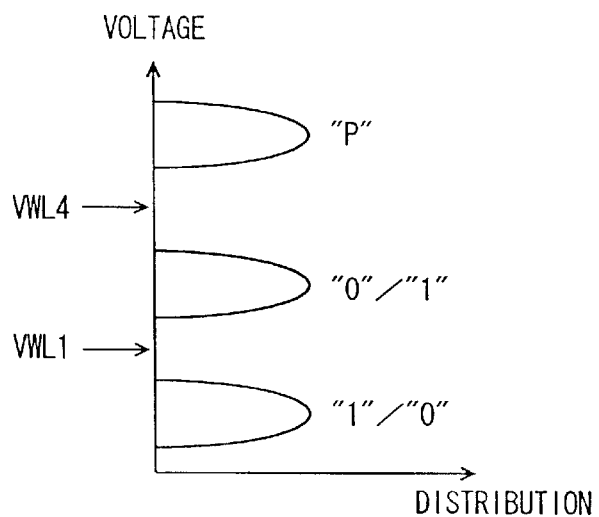
FIG. 15 shows the distribution of threshold voltages of memory cells in the NAND-type flash memory shown in FIG. 14.

In the NAND-type flash memory, the distribution of the threshold voltages of memory cells is set as shown in FIG. 15. Also in the NAND-type flash memory, any correspondence relationship between the write/erasure state and the high/low threshold state may be possible. To set the memory cells in the lock mode state, the target memory cells are set to have threshold voltages higher than non-selected read voltage VWL4, as shown in FIG. 15. This allows the memory cells in the lock mode state to maintain non-conductive, irrespective of the voltage level on the word line, cutting off the path in which current flows in the memory cell unit MUT, and thus no data reading is carried out.

Thus, in a case where e.g. memory cells connected to word line WL2 (indicated by circles) in FIG. 14 are set to be in the lock mode state, even if word line WL1 is selected, the memory cells MC connected to word line WL2 maintains non-conductive, so that the data in the memory cells connected to word line WL1 cannot be read out. In reading of the data in the memory cells connected to word lines WL6 to WL10, sector selecting signals VD1 and VS1 are set to be at the L level to turn off sector selecting transistors DST1 and SST1, and thus the memory cells in the lock mode state are isolated from bit lines BL1 to BL4. Therefore, by setting sector selecting signals VD2 and VS2 to be at a logic high or an H level, the data in the memory cells connected to word lines WL6 to WL10 can be read out.

In the NAND-type flash memory, the operation for setting the lock mode may be carried out using the process procedure for increasing the threshold voltages of target memory cells. For example, when the written state is a state having a high threshold voltage ("0" region) shown in FIG. 15, the processes in the lock mode and in the unlock mode can be executed using the process procedures shown in FIGS. 7 and 8. In the lock mode, however, a voltage higher than the read non-selecting voltage is used as a write verification voltage, to reliably maintain the memory cells in the lock mode state non-conductive.

On the other hand, when the erasure state is associated with the high-threshold state, the process procedures shown in FIGS. 1 and 3 can be used to execute the lock mode operation and the unlock mode operation.

In the NAND-type flash memory, the over-write verifying operation or the over-erasure verifying operation is carried out to prevent the threshold voltage of the memory cells from increasing too much, exceeding read non-selecting voltage VWL4, in the process of increasing the threshold voltage. Memory cells are set to be in the lock mode state by changing the verification voltage used for the verification in the lock mode. If the threshold voltage is too much increased in the first verification in the process procedure of increasing the threshold voltage, the operation for lowering the threshold voltage is carried out. Therefore, the process procedure of the verifying operation for the write-back or the erase-back can be used to execute the process of the unlocking operation. Thus, also in the NAND-type flash memory, the data concealing function can be realized using an existing erasure/write process sequence by a process procedure similar to those in the first and second embodiments described previously, without any addition of a dedicated circuit for ensuring the security.

Seventh Embodiment

Figure 16:
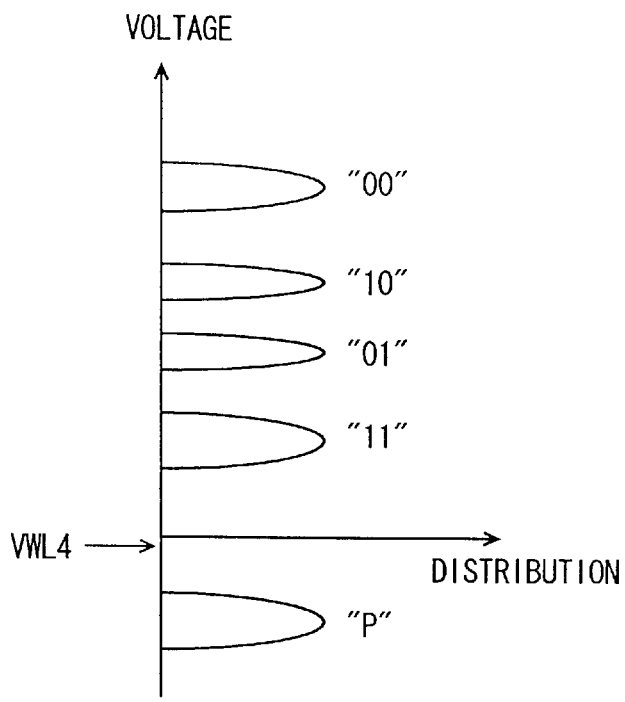
FIG. 16 shows the distribution of threshold voltages of memory cells in a flash memory according to the seventh embodiment of the present invention.

FIG. 16 shows the distribution of the threshold voltages of memory cells in a flash memory according to the seventh embodiment of the present invention. In FIG. 16, a memory cell can store four-level data, and the distribution region of the threshold voltages is divided into four data storage regions. In the lock mode state, the threshold voltages are also distributed in a region "P" where the threshold voltages are lower than non-selected word line voltage VWL4 in data reading, in addition to the four-level regions. Also in such a multi-valued memory, the process procedures for the lock mode and the unlock mode in the first to third embodiments described earlier can be used to set memory cells to be in the locked state and the unlocked state. The distribution of the threshold voltages shown in FIG. 16 is for the configurations of AND-, NOR- and DINOR-type flash memories, and read non-selecting voltage VWL4 at the L level (e.g. the ground voltage or a negative voltage) is applied to a non-selected word line in the data reading.

Figure 17:
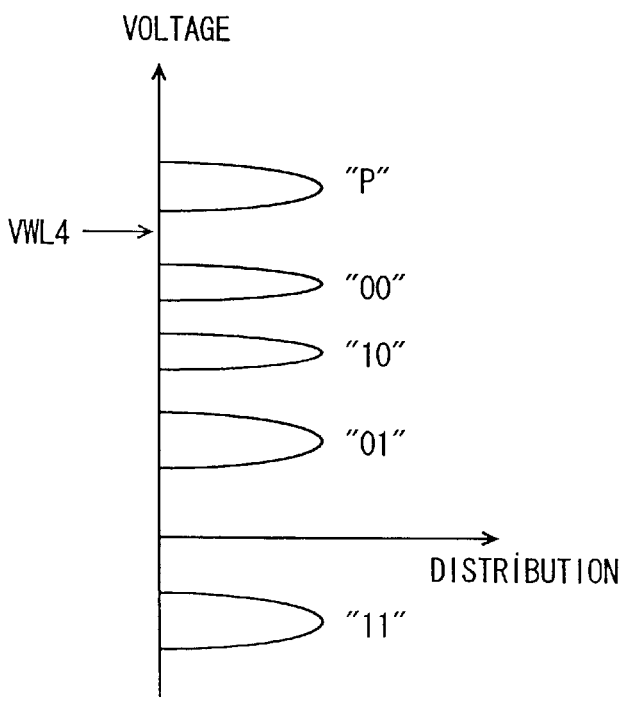
FIG. 17 shows a modified example of the distribution of threshold voltages of memory cells according to the seventh embodiment of the present invention.

Modification:

FIG. 17 shows a modification of the distribution of the threshold voltages of memory cells in a flash memory according to the seventh embodiment of the present invention. Similarly, in the distribution of the threshold voltages of the memory cells shown in FIG. 17, the distribution region of the threshold voltages is divided into four regions corresponding to four-level data. In FIG. 17, the distribution of the threshold voltages of memory cells in an NAND-type flash memory is shown, in which the voltage of a non-selected word line in data reading is the voltage VWL4, having a voltage level higher than any threshold voltage for the data in the highest distribution region of the threshold voltages. Thus, the threshold voltages of target memory cells are controlled to be within a region where the threshold voltages of the memory cells are higher than non-selecting voltage VWL4 in the lock mode state.

In the unlocked state, it is only required that the distribution of the threshold voltages of the memory cells may have a different polarity with respect to read non-selecting voltage VWL4 from the distribution thereof in the locked state. For example, in FIG. 16, the unlocked state corresponds to a region having the distribution of threshold voltages corresponding to data "00", whereas in FIG. 17, the unlocked state corresponds to a region where data "11" is stored.

Note that, in the distribution of the threshold voltages shown in FIGS. 16 and 17, data "11," "01," "10" and "00" correspond to regions having highest, higher, lower and lowest threshold voltages, respectively, in this order. However, the correspondence relationship between the distribution region of the threshold voltages and the stored data is arbitrary. Further, one memory cell may store multiple-valued data other than the four-level data.

Therefore, similarly, in such a multi-valued flash memory, the configuration of the memory array is similar to an array configuration of any of the flash memories described in the previous embodiments, and hence data can be concealed by setting memory cells to be in the lock mode state.

As described above, according to the present invention, memory cells can affect reading of data in the other memory cells when set in the lock mode state, so that the lock function of concealing the stored data and the unlock function of restoring the data concealed by the lock function can easily be implemented with minimum necessary increase of a control sequence, without addition of a dedicated circuit. Therefore, a flash memory with high security can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a memory array having a plurality of non-volatile memory cells arranged in rows and columns, each of said non-volatile memory cells being constituted by a memory transistor having a threshold voltage varied in accordance with storage information;
    a plurality of bit lines arranged corresponding to the columns of said memory array;
    a plurality of word lines corresponding to the rows of said memory array;
    read circuitry for reading data according to whether a selected bit line is connected to a predetermined voltage source via a corresponding memory cell in data reading; and
    control circuitry for setting a state of at least one row of memory cells to a first state, different in threshold voltage from that of the memory cells in an another row, so as to affect reading of data in the another row of memory cells in accordance with an instruction of a first operation mode.

2. The non-volatile semiconductor memory device according to claim 1, wherein
    the memory cells in each column are connected in parallel to a bit line arranged in a corresponding column, and
    said control circuitry renders said at least one row of memory cells conductive, as said first state, even if a read non-selecting voltage setting a word line in a non-selected state is applied onto a corresponding word line in a data reading operation mode.

3. The non-volatile semiconductor memory device according to claim 1, wherein
    each of said non-volatile memory cells has a threshold voltage in an erasure state lower than a threshold voltage in a written state, and
    said control circuitry changes a voltage level of an erasure verification voltage used for determining whether erasure is correctly performed, in said first operation mode.

4. The non-volatile semiconductor memory device according to claim 1, wherein
    each of said non-volatile memory cells has a threshold voltage in an erasure state higher than a threshold voltage in a written state, and
    said control circuitry changes a voltage level of a write verification voltage used for determining whether writing is correctly performed, in said first operation mode.

5. The non-volatile semiconductor memory device according to claim 1, wherein
    said control circuitry further sets said at least one row of memory cells to be in a second state different from said first state, in a second operation mode.

6. The non-volatile semiconductor memory device according to claim 5, wherein
    each of said non-volatile memory cells has a threshold voltage in an erasure state higher than a threshold voltage in a written state, and
    said control circuitry changes a voltage level of an erasure verification voltage used for determining whether erasure is correctly performed, in said second operation mode.

7. The non-volatile semiconductor memory device according to claim 5, wherein
    each of said non-volatile memory cells has a threshold voltage in an erasure state lower than a threshold voltage in a written state, and said control circuitry changes a voltage level of a write verification voltage used for determining whether writing is correctly performed, in said second operation mode.

8. The non-volatile semiconductor memory device according to claim 1, wherein the memory cells in each column are connected in series to a bit line arranged in a corresponding column in a unit of a predetermined number of the memory cells, and said control circuitry renders said at least one row of memory cells non-conductive, as said first state, even if a read non-selecting voltage setting a word line into a non-selected state is applied to a corresponding word line in a data reading mode of operation, in said first operation mode.

9. The non-volatile semiconductor memory device according to claim 1, wherein said control circuitry sets said at least one row of memory cells to be in a second state where the memory cells are rendered non-conductive even if a word line arranged corresponding to said at least one row is selected to receive a read voltage, in a second operation mode.

10. The non-volatile semiconductor memory device according to claim 1, wherein each of said bit lines is divided into a plurality of sub bit lines each connecting to a predetermined number of memory cells on a corresponding column.

11. The non-volatile semiconductor memory device according to claim 1, wherein each of the memory cells has at least two different threshold voltages in accordance with stored information.

12. The non-volatile semiconductor memory device according to claim 1, wherein said control circuitry destructs data in at least a part of said plurality of non-volatile memory cells, when an address different from an address of said at least one row of memory cells is applied upon instruction of a second operation mode of setting the memory cells of said at least one row to be in a second state different from said first state.

13. The non-volatile semiconductor device according to claim 1, wherein the first state restricts reading of data in the another row.

* * * * *